United States Patent
Okada et al.

(10) Patent No.: US 9,580,827 B2
(45) Date of Patent: Feb. 28, 2017

(54) METHOD FOR PRODUCING ELECTRONIC COMPONENT, BUMP-FORMED PLATE-LIKE MEMBER, ELECTRONIC COMPONENT, AND METHOD FOR PRODUCING BUMP-FORMED PLATE-LIKE MEMBER

(71) Applicant: TOWA CORPORATION, Kyoto-shi, Kyoto (JP)

(72) Inventors: Hirokazu Okada, Kyoto (JP); Hiroshi Uragami, Kyoto (JP); Tsuyoshi Amakawa, Kyoto (JP); Muneo Miura, Kyoto (JP)

(73) Assignee: Towa Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 14/755,819

(22) Filed: Jun. 30, 2015

(65) Prior Publication Data

US 2016/0020187 A1    Jan. 21, 2016

(30) Foreign Application Priority Data

Jul. 18, 2014    (JP) ................................ 2014-148144

(51) Int. Cl.
*H01L 21/50*    (2006.01)
*C25D 1/00*    (2006.01)
(Continued)

(52) U.S. Cl.
CPC .............. *C25D 1/00* (2013.01); *H01L 21/565* (2013.01); *H01L 23/3121* (2013.01);
(Continued)

(58) Field of Classification Search
CPC ..... H01L 24/97; H01L 21/565; H01L 23/552; H01L 23/3121
(Continued)

(56) References Cited

U.S. PATENT DOCUMENTS 4,639,759 A * 1/1987 Neidig .................... H01L 25/18
174/16.3
6,580,167 B1 * 6/2003 Glenn ................. H01L 23/3128
257/706
(Continued)

FOREIGN PATENT DOCUMENTS

EP         2560201 A2    2/2013
JP     2004-174801 A    6/2004
(Continued)

OTHER PUBLICATIONS

Office Action for the corresponding Japanese Patent Application No. 2014-090753 mailed Sep. 30, 2015 and its partial translation.
(Continued)

*Primary Examiner* — Luan C Thai
(74) *Attorney, Agent, or Firm* — Muncy, Geissler, Olds & Lowe, P.C.

(57) ABSTRACT

The present invention provides a method for producing an electronic component, capable of simply and efficiently producing an electronic component having both of a via electrode(s) (bump(s)) and a plate-like member. The method is a method for producing an electronic component. The electronic component includes: a substrate 21, a chip(s) 31, a resin 41, a plate-like member 11 having a surface(s), a bump(s) 12 that includes a deformable portion 12A, and a wiring pattern 22. The method includes: disposing the chip(s) 31 on the surface(s); and encapsulating the bump(s) 31 in the resin 41. The encapsulating includes: encapsulating the chip(s) 31 in the resin 41 between a bump 12-formed surface of the plate-like member 11 on which the bump(s) 12 is formed and a wiring pattern 22-formed surface of the substrate 21 on which the wiring pattern is formed; and causing the bump(s) 12 to be in contact with the wiring pattern 22.

45 Claims, 18 Drawing Sheets

(51) Int. Cl.
*H01L 23/31* (2006.01)
*H01L 23/552* (2006.01)
*H01L 23/00* (2006.01)
*H05K 1/02* (2006.01)
*H01L 21/56* (2006.01)
*H05K 3/28* (2006.01)

(52) U.S. Cl.
CPC ............ *H01L 23/552* (2013.01); *H01L 24/97* (2013.01); *H05K 1/0209* (2013.01); *H05K 1/0216* (2013.01); *H01L 2924/14* (2013.01); *H05K 3/284* (2013.01); *H05K 2201/066* (2013.01); *H05K 2201/10371* (2013.01)

(58) Field of Classification Search
USPC .......................................................... 438/122
See application file for complete search history.

(56) References Cited

U.S. PATENT DOCUMENTS

| | | | | |
|---|---|---|---|---|
| 6,775,140 | B2* | 8/2004 | Shim, II | H01L 21/4878 257/706 |
| 7,259,445 | B2* | 8/2007 | Lau | H01L 21/561 257/675 |
| 7,989,707 | B2* | 8/2011 | Yamano | H01L 21/6835 174/260 |
| 8,012,799 | B1* | 9/2011 | Ibrahim | H01L 21/566 438/107 |
| 8,178,956 | B2* | 5/2012 | Do | H01L 23/552 257/659 |
| 8,319,333 | B2 | 11/2012 | Oka et al. | |
| 8,395,254 | B2* | 3/2013 | Espiritu | H01L 23/4334 257/706 |
| 2001/0024724 | A1 | 9/2001 | Mccullough | |
| 2003/0071348 | A1 | 4/2003 | Eguchi | |
| 2004/0141291 | A1 | 7/2004 | Chen | |
| 2006/0060891 | A1 | 3/2006 | Pavier | |
| 2006/0186576 | A1 | 8/2006 | Takase et al. | |
| 2008/0265355 | A1 | 10/2008 | Yoshizawa | |
| 2009/0068302 | A1 | 3/2009 | Nakamura et al. | |
| 2009/0121351 | A1 | 5/2009 | Endo | |
| 2009/0140402 | A1 | 6/2009 | Ohtani | |
| 2009/0146301 | A1 | 6/2009 | Shimizu | |
| 2009/0151995 | A1 | 6/2009 | Koizumi et al. | |
| 2010/0127383 | A1 | 5/2010 | Oka et al. | |
| 2011/0198743 | A1 | 8/2011 | Nikitin | |
| 2012/0261699 | A1 | 10/2012 | Ooyabu | |
| 2013/0119523 | A1 | 5/2013 | Cheng | |
| 2013/0270683 | A1 | 10/2013 | Tsai | |
| 2013/0337614 | A1 | 12/2013 | Fuergut | |
| 2014/0083671 | A1 | 3/2014 | Ideguchi et al. | |
| 2014/0262475 | A1 | 9/2014 | Liu et al. | |
| 2015/0008583 | A1 | 1/2015 | Gerber | |
| 2015/0017372 | A1 | 1/2015 | Uragami et al. | |
| 2015/0170986 | A1 | 6/2015 | Szymanowski | |

FOREIGN PATENT DOCUMENTS

| | | |
|---|---|---|
| JP | 2005-225133 A | 8/2005 |
| JP | 2006-287101 A | 10/2006 |
| JP | 2007-125783 A | 5/2007 |
| JP | 2007-287937 A | 11/2007 |
| JP | 2010-036542 A | 2/2010 |
| JP | 2010-069656 A | 4/2010 |
| JP | 2010-129550 A | 6/2010 |
| JP | 2012-015216 A | 1/2012 |
| JP | 2013-058516 A | 3/2013 |
| JP | 2013-187340 A | 9/2013 |
| JP | 2013-239512 A | 11/2013 |
| JP | 2014-123618 A | 7/2014 |
| TW | 463334 B | 11/2001 |
| TW | 200929478 A | 7/2009 |
| TW | 201311073 A1 | 3/2013 |
| TW | 201338063 A | 9/2013 |

OTHER PUBLICATIONS

Office Action issued in the related U.S. Appl. No. 14/581,624 dated Apr. 1, 2016.

Office Action in the related Singapore Patent Application No. 10201509770R dated May 10, 2016.

Office Action issued in the corresponding Taiwanese Patent Application (No. 103140295) dated Jul. 21, 2016.

* cited by examiner (A)

(B)

(C)

METHOD FOR PRODUCING ELECTRONIC COMPONENT, BUMP-FORMED PLATE-LIKE MEMBER, ELECTRONIC COMPONENT, AND METHOD FOR PRODUCING BUMP-FORMED PLATE-LIKE MEMBER

CROSS-REFERENCE TO RELATED APPLICATION

This application is based upon and claims the benefit of priority from Japanese patent application No. 2014-148144, filed on Jul. 18, 2014, the disclosure of which is incorporated herein in its entirety by reference.

BACKGROUND OF THE INVENTION

The present invention relates to a method for producing an electronic component, a bump-formed plate-like member, an electronic component, and a method for producing a bump-formed plate-like member.

An electronic component such as an IC or a semiconductor chip is molded and used as a resin-encapsulated electronic component in many cases.

The electronic component being a chip encapsulated in a resin (hereinafter also referred to as a completed electronic component, a package, or the like, hereinafter also merely referred to as an "electronic component") is formed by embedding a via electrode in a resin in some cases. This via electrode can be formed by, for example, forming a hole or a groove for via formation (hereinafter referred to as a "hole for via formation") in the resin of the resin-encapsulated electronic component (package) from the upper surface of the package and embedding a material for forming a via electrode (e.g., plating, a shielding material, or the like) in the hole for via formation. The hole for via formation can be formed by irradiating the resin with a laser beam from the upper surface of the package, for example. Moreover, as another method for forming a via electrode, a method in which a projection in a metal structure having the projection is subjected to resin-encapsulation together with a semiconductor chip, and thereafter, the metal structure except for the projection is removed has been proposed (JP 2012-015216 A). In this case, only the projection of the metal structure remains in the electronic component in the state of being subjected to resin-encapsulation, and this projection becomes a via electrode.

On the other hand, the electronic component is molded together with a plate-like member such as a heat radiation plate (heat sink) for cooling by discharging heat generated from the chip or a shield plate (shield) for shielding an electromagnetic wave generated from the chip (e.g., JP 2013-187340 A and JP 2007-287937 A).

BRIEF SUMMARY OF THE INVENTION

For example, the method in which a hole for via formation is formed in a resin involves the following problems (1) to (5):
(1) there is a possibility that the depth and the like of a hole for via formation are not correctly appropriately formed on a wiring pattern of a substrate due to variations in thickness of the electronic component (package) and the like;
(2) Fillers contained in a resin material are prone to remain on a wiring pattern of a substrate;
(3) According to the conditions under which a hole for via formation is bored in the resin, there is a possibility that damage is caused to a wiring pattern on an chip-mounted substrate;
(4) In association with the problem (3), when the density of the fillers in the resin material differs, it is required to change the conditions under which a laser processing of boring a hole for via formation in the resin is performed, i.e., it is complicated to control the conditions under which a hole for via formation is formed; and
(5) By the influences of the problems (1) to (4), it is difficult to improve the yield in production of an electronic component (package).

On the other hand, in the method disclosed in JP 2012-015216 A, it is required to perform removing the metal structure except for the projection after resin-encapsulation of the projection in the metal structure. Therefore, producing an electronic component (package) is complicated, and the material is wasted.

Moreover, in any of the above-described methods, in order to form a plate-like member, plating or the like is required to be performed after formation of a via electrode. Thus, the steps are complicated.

Although JP 2013-187340 A and JP 2007-287937 A disclose an electronic component having a plate-like member and a method for producing the same, none of them discloses a method by which the problems of the above-described methods are solved in formation of a via electrode.

As described above, there has been no technology capable of simply and efficiently producing an electronic component having both of a via electrode(s) and a plate-like member.

Hence the present invention is intended to provide a method for producing an electronic component, a bump-formed plate-like member, an electronic component, and a method for producing a bump-formed plate-like member, capable of simply and efficiently producing an electronic component having both of a via electrode(s) and a plate-like member.

In order to achieve the aforementioned object, the method for producing an electronic component according to the present invention (hereinafter also merely referred to as "the production method according to the present invention") is a method for producing an electronic component including: a substrate, at least one chip, a resin, a plate-like member having at least one surface, at least one bump that includes a deformable portion, and a wiring pattern, the method including: disposing the one chip on the surface; and encapsulating the at least one chip in the resin; wherein the encapsulating includes: encapsulating the at least one chip in the resin between a bump-formed surface of the plate-like member on which the one bump is formed and a wiring pattern-formed surface of the substrate on which the wiring pattern is formed; and causing the at least one bump to be in contact with the wiring pattern.

The bump-formed plate-like member according to the present invention is for use in the production method according to the present invention, and the at least one bump is formed on a plate-like member.

The electronic component according to the present invention is an electronic component including: a substrate; at least one chip; a resin; and the bump-formed plate-like member according to the present invention, wherein the at least one chip is arranged on the substrate and encapsulated in the resin, a wiring pattern is formed on the substrate on a side on which the at least one chip is arranged, and the at least one bump penetrates the resin and is in contact with the wiring pattern.

According to the present invention, a method for producing an electronic component, a bump-formed plate-like member, an electronic component, and a method for producing a bump-formed plate-like member, capable of simply and efficiently producing an electronic component having both of a via electrode(s) (bump(s)) and a plate-like member can be provided.

DETAILED DESCRIPTION OF THE INVENTION

Figure 1A:
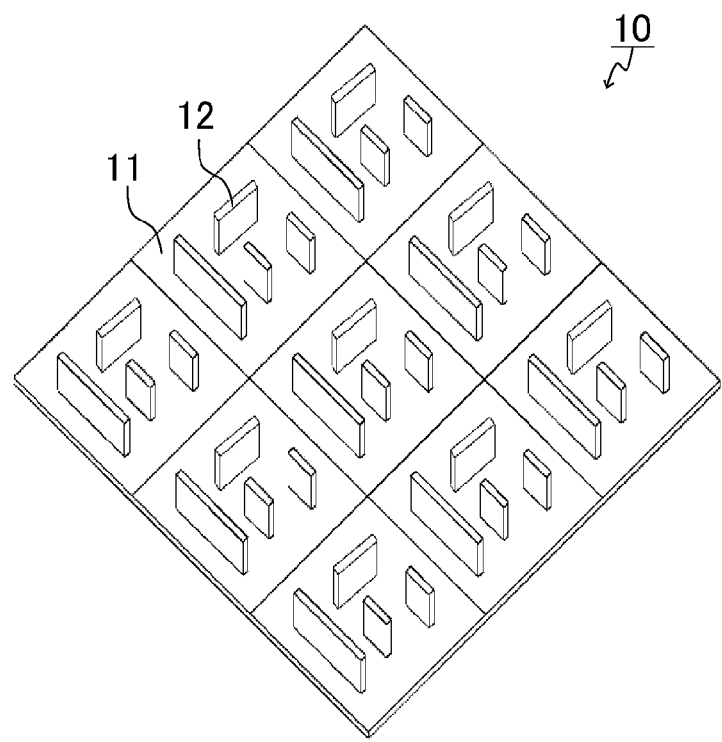
FIGS. 1A and 1B are perspective views showing examples of the structure of the bump-formed plate-like member according to the present invention.

The present invention is described in more detail below with reference to examples. The present invention, however, is not limited by the following description. In the present invention, as mentioned below, a "bump-formed plate-like member (plate-like member on which a bump(s) is formed) having a deformable portion" composed of a bump(s) having a deformable portion and a plate-like member is used. In the present invention, a "chip" refers to an electronic component before resin-encapsulation and can be, for example, specifically a chip-like electronic component such as an IC or a semiconductor chip. In the present invention, an electronic component before resin-encapsulation is referred to as a "chip" as a matter of convenience in order to differentiate from an electronic component after resin-encapsulation. However, the "chip" in the present invention is not limited to particular electronic components, may be any electronic component before resin-encapsulation, and may not be a chip-like electronic component. A mere "electronic component" in the present invention refers to an electronic component being the chip encapsulated in a resin (a completed electronic component), unless otherwise mentioned.

In the production method according to the present invention, the number of the bumps is not limited to particular numbers and may be any number of one or more. The shape of the bump is not limited to particular shapes. When there are plural bumps, the shapes of the bumps may be identical to or different from each other. For example, at least one bump may be a zigzag bump. In the zigzag bump, at least the deformable portion may be capable of being shrunk in a direction perpendicular to a plane direction of the plate-like member (hereinafter also referred to as the perpendicular direction) by zigzagging the deformable portion as viewed in a direction parallel with the plane direction of the plate-like member. In the zigzag bump, at least the deformable portion may be zigzagged, and the portion other than the deformable portion may not be zigzagged. The shape of the zigzag bump may be, for example, any of the shapes shown in FIGS. 2A to 2B and (A) to (C) in FIG. 4 mentioned below. For example, at least one bump may have a through hole. More specifically, the through may peneturate in a direction parallel with a plane direction (plate surface) of the plate-like member, and the deformable portion which is deformable by shrinking in the direction perpendicular to the plane direction of the plate-like member surrounds the through hole. The at least one bump may have a projection projecting at the end opposite to an end formed in the plate-like member in a direction perpendicular to a plate surface of the plate-like member. The shape of such bump can be, for example, more specifically any of the shapes shown in (A) to (C) in FIGS. 3 and (A) to (C) in FIG. 4 mentioned below. In the bump-formed plate-like member according to the present invention, the deformation of the deformable portion in the bump(s) may be an elastic deformation or a plastic deformation. That is, the deformable portion may be a portion (elastic portion) capable of being subjected to an elastic deformation or a portion (plastic portion) capable of being subjected to a plastic deformation. Whether the deformation is an elastic deformation or a plastic deformation depends on a material of the bump(s) and the like, for example.

In the production method according to the present invention, at least one bump may be a columnar bump having a columnar shape. Examples of the shape of the columnar bump include a cylindrical shape, a prismatic shape, a cone shape, a pyramid shape, a truncated cone shape, and a truncated pyramid shape. For example, in the case of using a columnar bump having a columnar shape, the entire bump may be a deformable portion which is deformable by shrinking in the direction perpendicular to the plane direction of the plate-like member. In this case, for example, the bump may have a bent barrel shape by entirely swelling the side surface of the cylindrical shape.

In the production method according to the present invention, at least one bump may be a plate-like bump. In this case, there are plural chips, and in the encapsulating, the substrate may be partitioned into plural regions with the plate-like bump, and the chips may be encapsulated in the resin in the plural regions. Moreover, it is preferred that the plate-like bump has a through hole and a projection, the through hole penetrates the plate-like bump in a direction parallel with a plate surface of the plate-like member, the deformable portion which is deformable by shrinking in the direction perpendicular to the plane direction of the plate-like member surrounds the through hole, and the projection projects at the end opposite to an end formed in the plate-like member in a direction perpendicular to the plate surface of the plate-like member.

In the production method according to the present invention, the plate-like member is not limited to particular plate-like member and is preferably a heat radiation plate (heat sink) or a shield plate (shield). The shield plate may shield an electromagnetic wave emitted from the chip(s), for example. It is preferred that the heat radiation plate has a heat radiation fin on the surface opposite to the bump-formed surface. The shape of the plate-like member is not limited to particular shapes except that the bump(s) are formed therein. For example, when the plate-like member is a heat radiation plate, the heat radiation plate has a shape (e.g., fin shape) in which, in addition to the bump(s), one or more projections for improving heat radiation efficiency are bound thereto or the like. The material of the plate-like member also is not limited to particular materials, and when the plate-like member is a heat radiation plate or a shield plate, a metal material, a ceramics material, a resin, or a metal vapor deposition film can be used, for example. The metal vapor deposition film is not limited to particular films and may be, for example, a metal vapor deposition film obtained by vapor deposition of aluminium, silver, or the like on a film. Moreover, although the material of the bump(s) is not limited to particular materials, a metal material, a ceramics material, a resin, or the like can be used, for example. The metal material is not limited to particular materials, and examples thereof include: an iron-based material such as stainless or Permalloy (alloy of iron and nickel); a copper-based material such as brass, a copper-molybdenum alloy, or beryllium copper; and an aluminium-based material such as duralumin. Although the ceramics material is not limited to particular materials, examples thereof include: an alumina-based material such as aluminum nitride; a silicon-based material such as silicon nitride; and zirconia-based material. Although the resin is not limited to particular resins, examples thereof include: a rubber-based material such as an elastomer resin; a material obtained by mixing a conductive material in a silicon-based base material; and a resin material obtained by extrusion molding or injection molding of any of these materials. A conductive layer may be formed on the surface of the plate-like member or the like in the bump-formed plate-like member by a surface treatment such as plating or coating. The plate-like member is also a functional member (working member) that has any function. For example, in the case where the plate-like member is a heat radiation plate (heat sink), the plate-like member is a functional member (working member) having a heat radiation function (heat radiation action), and in the case where the plate-like member is a shield plate (shield), the plate-like member is a functional member (working member) having a shielding function (shielding action).

In the encapsulating, a method for use in the resin-encapsulation (molding method) is not limited to particular methods, and for example, any of transfer molding, compression molding, and the like may be used.

In the case where compression molding is used in the encapsulating, the production method according to the present invention may further include placing the resin on the bump-formed surface of the bump-formed plate-like member. Moreover, in this case, the production method according to the present invention may further include transferring the bump-formed plate-like member to a die cavity in a molding die. The encapsulating may be performed by compression molding of the resin in the die cavity together with the bump-formed plate-like member and the chip(s) in the state where the chip(s) is immersed in the resin placed on the plate-like member.

The order of performing the placing the resin and the transferring the bump-formed plate-like member is not limited to particular orders. Any of them may be performed prior to the other, or both of them may be performed at the same time. For example, in the transferring the bump-formed plate-like member, the resin may be transferred to a die cavity in a molding die together with the pump-formed plate-like member in the state where the resin is placed on the bump-formed plate-like member. Furthermore, in the transferring the bump-formed plate-like member, the bump-formed plate-like member may be transferred to a die cavity in a molding die in the state where the resin is not placed on the bump-formed plate-like member. In this case, the production method according to the present invention may further include heating the bump-formed plate-like member in the die cavity prior to theplacing the resin. Then, theplacing the resin may be performed in the die cavity in the state where the bump-formed plate-like member is heated.

In the transferring the bump-formed plate-like member, the bump-formed plate-like member may be transferred to the die cavity in the molding die in the state where the bump-formed plate-like member is placed on a release film so as to face the bump-formed surface upward. In this case, in the transferring the bump-formed plate-like member, the bump-formed plate-like member may be transferred to the die cavity in the molding die in the state where a frame is placed on the release film together with the bump-formed plated like member, and the bump-formed plate-like member is surrounded by the frame. In theplacing the resin, it is preferred that the resin is placed on the bump-formed surface by supplying the resin to a space surrounded by the bump-formed plate-like member and the frame in the state where the frame is placed on the release film together with the bump-formed plated like member, and the bump-formed plate-like member is surrounded by the frame. In such case, the order of performing theplacing the resin and the transferring the bump-formed plate-like member is not limited to particular orders. Any of them may be performed prior to the other, or both of them may be performed at the same time. However, it is preferred that theplacing the resin is performed prior to the transferring the bump-formed plate-like member.

Moreover, the surface opposite to the bump-formed surface of the bump-formed plate-like member may be fixed on the release film by a pressure-sensitive adhesive.

A transfer means for performing the transferring the bump-formed plate-like member may be a means for transferring the resin to a die cavity in a molding die in the state where the plate-like member on which the resin is placed is placed on the release film. In this case, a resin-encapsulation means for performing the resin-encapsulation may include a means for adsorbing a release film and may be a means for performing the compression molding in the state where the release film is adsorbed to the means for adsorbing a release film. Although the molding die is not limited to particular molding dies, the molding die can be, for example, a gold die or a ceramics die.

The bump-formed plate-like member according to the present invention is, as mentioned above, a bump-formed plate-like member for use in the production method according to the present invention, wherein the bump(s) is formed on the plate-like member. The number of the bump(s) and the shape of the bump(s) are not limited to particular numbers and shapes as mentioned above. For example, as mentioned above, at least one bump may be the plate-like bump. As mentioned above, it is preferred that the plate-like bump has a through hole and a projection, the through hole penetrates the plate-like bump in the direction parallel with a plate surface of the plate-like member, and the projection projects at the end opposite to an end formed in the plate-like member in the direction perpendicular to the plate surface of the plate-like member. Moreover, for example, as mentioned above, at least one bump may have a through hole. More specifically, as mentioned above, the through hole in the at least one bump (12) may be a through hole (12b) penetrating in the direction parallel with the plate surface of the plate-like member. Moreover, the at least one bump may further include a projection (12c) projecting at the end opposite to an end (12a side) formed in the plate-like member in the direction perpendicular to the plate surface of the plate-like member. Furthermore, as mentioned above, at least one bump may be a columnar bump having a columnar shape (e.g., a cylindrical shape, a prismatic shape, a cone shape, a pyramid shape, a truncated cone shape, or a truncated pyramid shape).

Although the shape of the plate-like member is not limited to particular shapes as mentioned above, the plate-like member may have a resin containing portion, for example. More specifically, for example, the plate-like member may have a protuberance at an outer edge toward the bump-formed surface of the plate-like member to form the resin containing portion in the central portion of the plate-like member Moreover, in the placing the resin of the production method according to the present invention, the resin may be placed in the resin containing portion of the plate-like member, and the encapsulating may be performed in the state where the resin is placed in the resin containing portion.

In the encapsulating, the substrate having the wiring pattern-formed surface on which the chip(s) is arranged may be placed on a substrate placement stage so as to face the wiring pattern-formed surface upward, and the "bump-formed plate-like member having a deformable portion" may be further pressed to the resin from the bump side in the state where the resin is placed on the wiring pattern-formed surface. Thus, the bump(s) can be connected to the wiring pattern on the substrate in which the chip(s) is placed.

In the production method according to the present invention, the resin is not limited to particular resins, and for example, the resin may either be a thermoplastic resin or a thermosetting resin. The resin may be at least one selected from the group consisting of a granular resin, a powdery resin, a liquid resin, a plate-like resin, a sheet-like resin, a film-like resin, and a paste-like resin, for example. Further, the resin may be at least one selected from the group consisting of a transparent resin, a translucent resin, and an opaque resin, for example.

The examples of the present invention are described below with reference to the drawings. Each drawing is schematically illustrated by appropriately omitting, exaggerating, and the like for convenience in explanation.

EXAMPLES

Example 1

In the present example, an example of a "bump-formed plate-like member having a deformable portion" according to the present invention, an example of an electronic component according to the present invention, using the bump-formed plate-like member having a deformable portion, and an example of a method for producing an electronic component, using transfer molding are described.

Figure 1B:
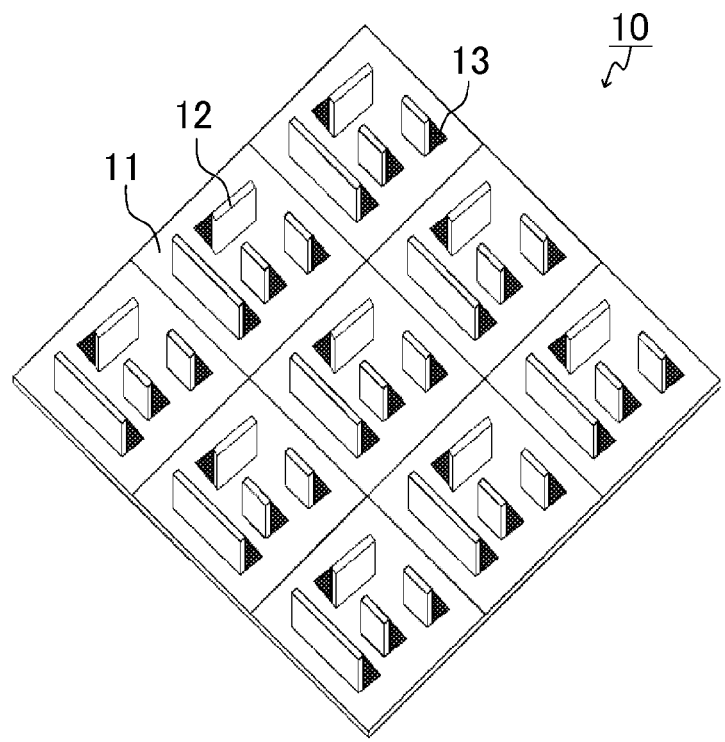

A structure of the bump-formed plate-like member having a deformable portion according to the present example is schematically shown in perspective views of FIGS. 1A and 1B. As shown in FIGS. 1A and 1B, this bump-formed plate-like member 10 having a deformable portion is formed by forming a pattern of a bump(s) 12 having a deformable portion on a plate-like member 11. Although the length (height) of the bump(s) 12 is not limited to particular lengths, the length can be set appropriately according to the thickness of a completed electronic component (molded package), for example. In the present invention, the pattern of the bump(s) is not limited to the pattern of the present example (FIGS. 1A and 1B) and may be any pattern.

There are two types of the structures of the bump-formed plate-like member 10 shown in the perspective views of FIGS. 1A and 1B. First, as shown in FIG. 1A, in this bump-formed plate-like member 10, a pattern of the bump(s) 12 is formed in the direction perpendicular to the plane direction of the metal plate (plate-like member) on the metal plate (plate-like member) 11. On the other hand, in FIG. 1B, in the bump-formed plate-like member 10, a part of the metal plate (plate-like member) 11 is blanked and bent in the direction perpendicular to the direction of the surface of the plate-like member 11 to form the bump(s). In the plate-like member 11, the blanked part forms a hole 13 as shown in FIG. 1B. The other part is the same as in FIG. 1A.

Figure 2A:
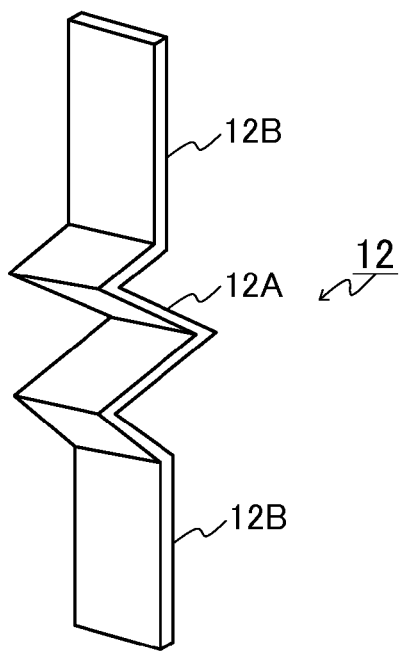
FIGS. 2A and 2B are perspective views showing, as examples, the structure of a bump in the bump-formed plate-like member according to the present invention.
Figure 2B:
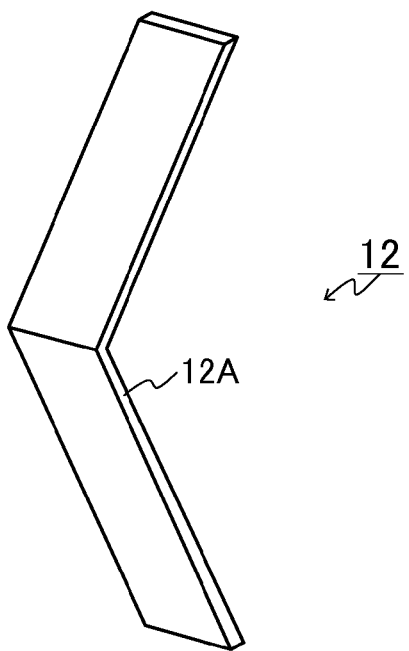

The structures of the bump(s) 12 and the deformable portion are not limited to particular structures. Each of FIGS. 2A and 2B is a perspective view showing an example of the structure of the bump(s) 12 shown in each of FIGS. 1A and 1B. In the perspective view of each of FIGS. 2A and 2B, the vertical direction of the plane of paper indicates a direction perpendicular to the plane direction of the plate-like member 11. In the bump 12 shown in FIG. 2A, a central portion includes a deformable portion 12A, and a portion other than the central portion is composed of a rigid portion (end portion of the bump 12) 12B. As shown in FIG. 2A, the deformable portion 12A is zigzagged as viewed in a direction parallel with the plane direction of the plate-like member 11. As shown in FIG. 2A, the bump 12 is capable of being shrunk in the perpendicular direction by zigzagging the deformable portion 12A. Moreover, the entire bump 12 shown in FIG. 2B is composed of a deformable portion 12A. The deformable portion 12A shown in FIG. 2B also is zigzagged as viewed in the direction parallel with the plate direction of the plate-like member 11. The entire bump 12 shown in FIG. 2B is capable of being deformed by shrinking in the perpendicular direction so as to bent in a V shape. Accordingly, for example, even in the case where the height of the bump 12 is designed so as to be higher than the thickness of the completed electronic component (mold package), the bump 12 suits on the thickness without being damaged at the time of molding. Thus, the height of the bump is not required to be designed according to the thickness in advance. Therefore, an electronic component having both of a via electrode(s) (bump(s)) and a plate-like member can be produced simply and efficiently.

Figure 3:
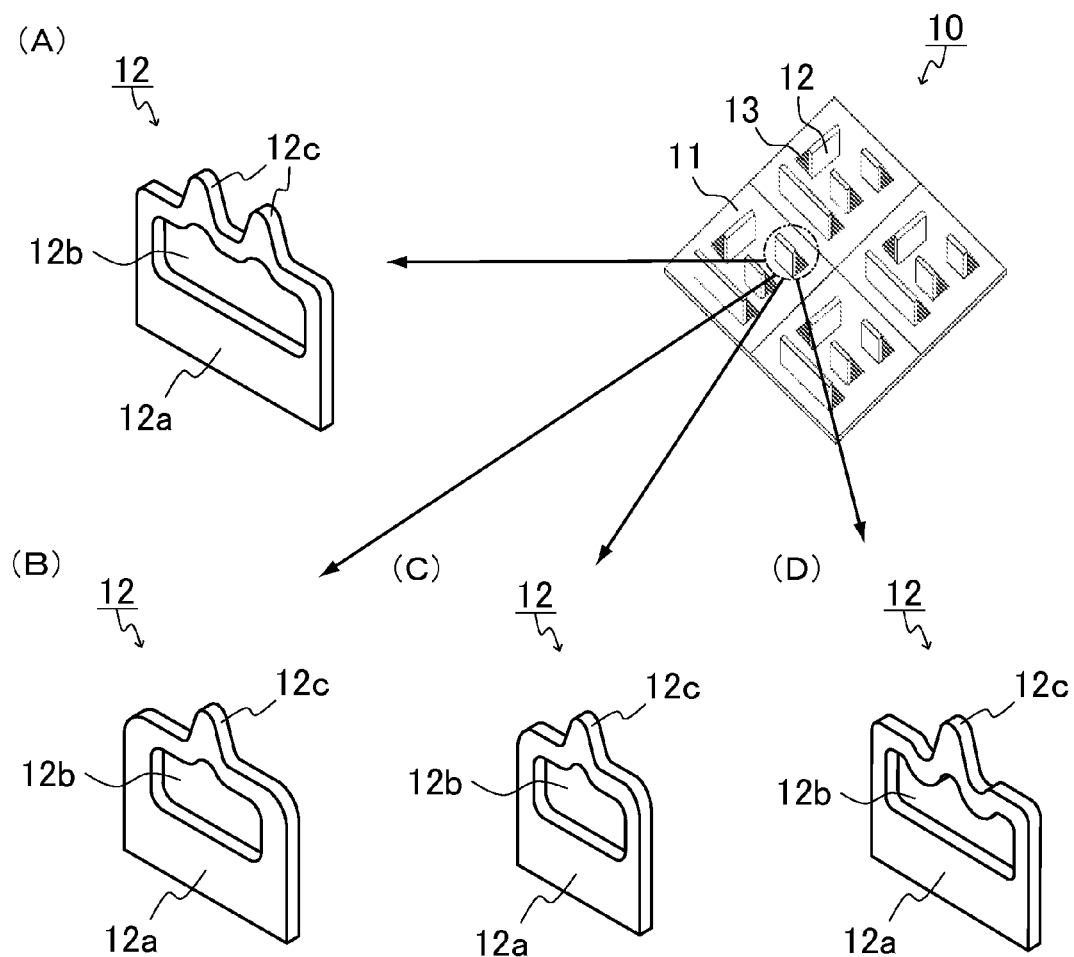
FIG. 3 shows perspective views showing, as other examples, the structure of a bump in the bump-formed plate-like member according to the present invention.

The shape of the bump(s) 12 is not limited to the structure of zigzagged deformable portion 12A shown in FIGS. 2A and 2B. For example, the shape of the bump(s) 12 may be a shape having a through hole 12B, more specifically, for example, any of the shapes shown in (A) to (D) in FIG. 3. In FIG. 3, an upper right drawing is a perspective view showing a part of the bump-formed plate-like member 10 of FIGS. 1A and 1B. Each of (A) to (C) in FIG. 3 is a perspective view schematically showing an example of the structure of a bump 12. As shown in each of (A) to (C) in FIG. 3, a lower part 12a of the bump 12 (connected to a plate-like member 11) has no hole. On the other hand, an upper part of the bump 12 (on the side opposite to the side of connecting to the plate-like member 11) has a hole (through hole) 12b penetrating the bump 12 in the direction parallel with the plate surface of the plate-like member 11. An upper end of the bump 12 (opposite to the end formed in the plate-like member 11) is partially projected toward an upper direction (direction perpendicular to the plate surface of the plate-like member 11) to form a projection 12c. The bump 12 can be in contact with a wiring pattern of a substrate (substrate electrode) at the tip of the projection 12c. In (A) in FIG. 3, the number of projections 12c is two. In (B) in FIG. 3, the number of projections 12c is one, and the projection 12c is the same as in (A) in FIG. 3 except that the width of the bump 12 is slightly narrower. In (C) in FIG. 3, the projection 12c is the same as in (B) in FIG. 3 except that the width of the bump 12 is further narrower. As described above, the number of projections 12c is not limited to particular numbers and may be one or more. Although the number of projections 12c is one or two in (A) to (C) in FIG. 3, the number may be three or more. Although the number of holes (through holes) 12b is one in (A) to (C) in FIG. 3, the number is not limited to particular numbers and may be any number, and there may be plural holes 12b.

When the bump(s) has a projection(s) 12c, the bump(s) 12 is prone to be in contact with the wiring pattern (substrate electrode) in the substrate without being interfered by the resin. That is, by the projection(s) 12c, the tip of the projection(s) 12c comes into contact with (is physically in contact with) and is electrically connected to the wiring pattern 22 through the resin (e.g., a molten resin or a liquid resin) between the bump(s) 12 and the wiring pattern 22 in FIG. 5 mentioned below. Moreover, when the bump(s) 12 has a hole(s) 12b, the resin-encapsulation of the chip(s) is performed more easily. That is, the resin can flow through the hole(s) 12b, so that the resin flows smoothly, and the efficiency of the resin-encapsulation is further improved. This effect is especially prominent in the case of transfer molding. Moreover, when the bump(s) 12 comes into contact with (is in contact with) the wiring pattern 22, the bump(s) 12 is bent around the hole(s) 12b as shown in (D) in FIG. 3. Thus, the height (length) of the bump(s) 12 can be reduced. That is, the bump 12 shown in each of (A) to (D) in FIG. 3, the deformable portion which is capable of being shrunk in a direction perpendicular to the plane direction of the plate-like member 11 surrounds the through hole 12b. Thus, the height of the bump(s) 12 can be adjusted according to the thickness of the resin (the thickness of the package) in the electronic component. Considering this point, the height (length) of the bump(s) 12 may be set to be slightly longer than the thickness of the resin (the thickness of the package) in advance.

Figure 4:
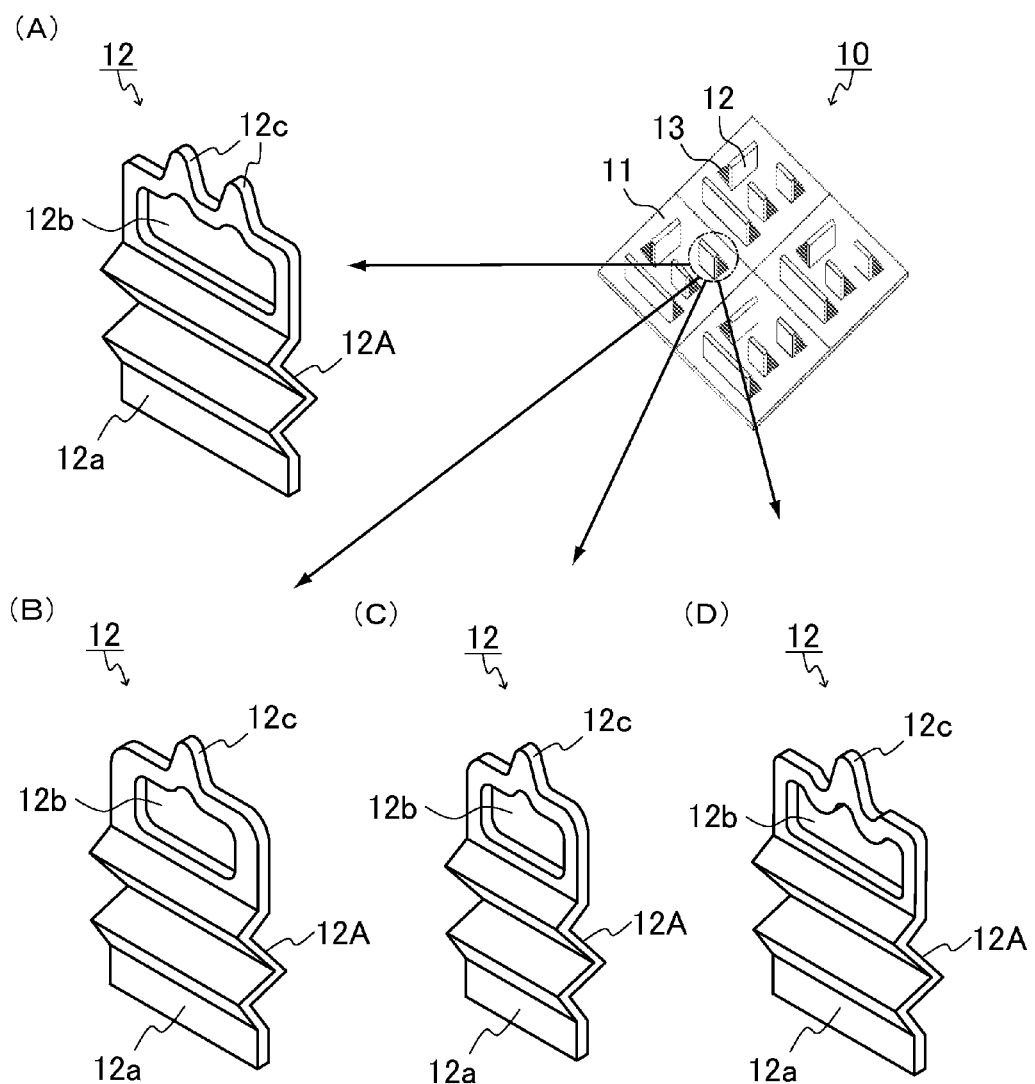
FIG. 4 shows perspective views showing, as yet other examples, the structure of a bump in the bump-formed plate-like member according to the present invention

The bump(s) 12 may be, for example, a zigzag bump having a through hole. That is, the bump(s) 12 may have both of a deformable portion zigzagged as viewed in the direction parallel with the plane direction of the plate-like member 11 and a through hole penetrating in the direction parallel with the plane direction of the plate-like member 11. An example of the structure of such bump(s) 12 is shown in each of (A) to (D) in FIG. 4. In FIG. 4, an upper right drawing is a perspective view showing a part of the bump-formed plate-like member 10 of FIGS. 1A and 1B. Each of (A) to (C) in FIG. 4 is a perspective view schematically showing an example of the structure of the bump 12. The bumps 12 in (A) to (C) in FIG. 4 are the same as (A) to (C) in FIG. 3 except that a lower part 12a (a part which is not bored on the side connecting to the plate-like member 11) and an upper part (a part having a through hole 12b on the side opposite to the side connecting to the plate-like member 11) of the bump 12 are integrated by connecting to each other via the deformable portion 12A. In each of (A) to (C) in FIG. 4, the deformable portion 12A is zigzagged as viewed in the direction parallel with the plane direction of the plate-like member 11 as in FIG. 2A. Thus, the deformable portion 12A is capable of being shrunk in the direction perpendicular to the plane direction of the plate-like member 11. As in (A) to (C) in FIG. 3, the height (length) of the bump(s) 12 shown in (A) to (C) in FIG. 4 can be reduced as shown in (D) in FIG. 4 by bending the bump(s) 12 around the hole 12b.

The shape of the bump(s) 12 is not limited to particular shapes except that the bump(s) includes the deformable portion and can be another shape in addition to or as substitute for the shapes shown in FIGS. 2A to 2B and (A) to (D) in FIGS. 3 and (A) to (D) in FIG. 4. For example, as mentioned above, at least one bump 12 may be a columnar bump having a columnar shape. Examples of the shape of the columnar bump include, as mentioned above, a cylindrical shape, a prismatic shape, a cone shape, a pyramid shape, a truncated cone shape, and a truncated pyramid shape.

Moreover, as mentioned above, at least one bump 12 may be a plate-like bump. In this case, as mentioned above, in the encapsulating of the production method according to the present invention, the substrate may be partitioned into plural regions with the plate-like bump, and the resin-encapsulation of the chip(s) may be performed in the regions. Moreover, the plate-like bump may have a through hole and a projection as in the bumps shown in (A) to (C) in FIG. 3. The through hole may penetrates the plate-like bump in the direction parallel with the plate surface of the plate-like member as in (A) to (C) in FIG. 3. Moreover, it is preferred that the projection projects at the end opposite to an end formed in the plate-like member in the direction perpendicular to the plate surface of the plate-like member as in (A) to (C) in FIG. 3. The number of through holes and the number of projections in the plate-like bump are not limited to particular numbers and may be any numbers, and there are preferably plural through holes and plural projections. When the plate-like bump has the through hole and the projection, the same advantageous effect as the through hole 12*b* and the projection 12*c* shown in (A) to (C) in FIG. 3 can be obtained. That is, first, when the plate-like bump has the projection, the plate-like bump is more easily in contact with the wiring pattern (substrate electrode) in the substrate without being interfered by the resin. When the plate-like bump has the through hole, the resin can flow through the through hole, so that the resin flows more smoothly, and the efficiency of the resin-encapsulation is further improved. This effect is especially prominent in the case of producing an electronic component by transfer molding (encapsulating a chip in a resin together with a bump-formed plate-like member). Moreover, when the plate-like bump is bent around the through hole, the height (length) of the plate-like bump can be reduced. Thus, the height of the plate-like bump can be adjusted according to the thickness of the resin (the thickness of the package) in the electronic component. Considering this point, the height (length) of the plate-like bump may be set to be slightly higher than the thickness of the resin (the thickness of the package) in advance.

Moreover, in the present invention, the deformable portion of the bump(s) is capable of being shrunk in the direction perpendicular to the plane direction of the plate-like member and may be deformed to any shape in addition to the shrinking in the perpendicular direction. For example, the deformable portion may be in the state of entirely enlarging in the lateral direction including the plate direction (horizontal plane direction) and the oblique direction of the plate-like member in addition to shrinking in the direction perpendicular to the plane direction of the plate-like member. The deformation depends on the material, shape, and the like of the plate-like member, for example.

Although examples of the method for producing a bump-formed plate-like member according to the present invention include a method in which a bump-formed plate-like member is produced by joining a plate-like member (metal plate) to a bump(s) and a method in which bump(s) are formed by using a metal plate as a plate-like member and blanking and bending the metal plate, the method is not limited thereby. Specifically, for example, the bump-formed plate-like member shown in FIG. 1A may be produced, according to a general technique, by any of the following methods (1) to (6):

(1) A method in which a bump-formed plate-like member is produced by etching a metal plate;
(2) A method in which a bump-formed plate-like member is produced by joining a metal plate to a bump(s);
(3) A method in which a plate-like member and a bump(s) are molded at the same time by electroforming;
(4) A method in which a plate-like member and a bump(s) are molded at the same time by a resin having conductivity (shielding properties) using injection molding, for example;
(5) A method in which a bump-formed plate-like member is produced by joining a bump(s) to a resin (plate-like member) having conductivity (shielding properties); and
(6) A method in which a resin plate and a substance having a projection are provided with a coating film having conductivity (shielding properties).

The method for producing a bump-formed plate-like member according to the present invention is not limited to particular methods as mentioned above. For example, the bump-formed plate-like member shown in FIG. 1B may be produced, according to a general technique, by the following method (7):

(7) A method in which a bump(s) having a deformable portion is produced by using a metal plate as a plate-like member and blanking and bending the metal plate. For example, first, the metal is stamped out into a shape corresponding to a bump having a deformable portion which has a required shape, and then, the stamped-out portion is bent perpendicularly to the metal plate. Thus, a bump-formed plate-like member having a deformable portion which has the required shape can be formed. Examples of the bump having a deformable portion which has a required shape include a bump having a deformable portion which has a through hole and a bump having a zigzag deformable portion.

Figure 5:
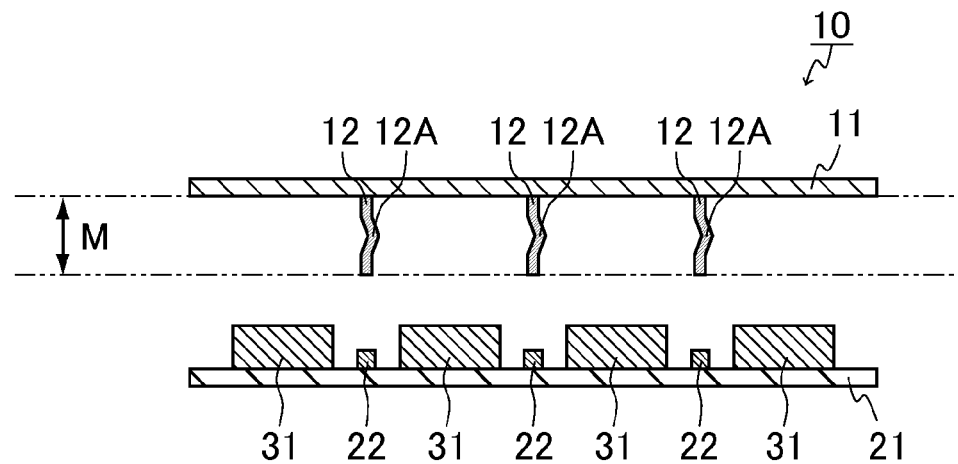
FIG. 5 shows step cross-sectional views showing the structure of the electronic component according to the present invention and an example of a production step thereof.
Figure 5:
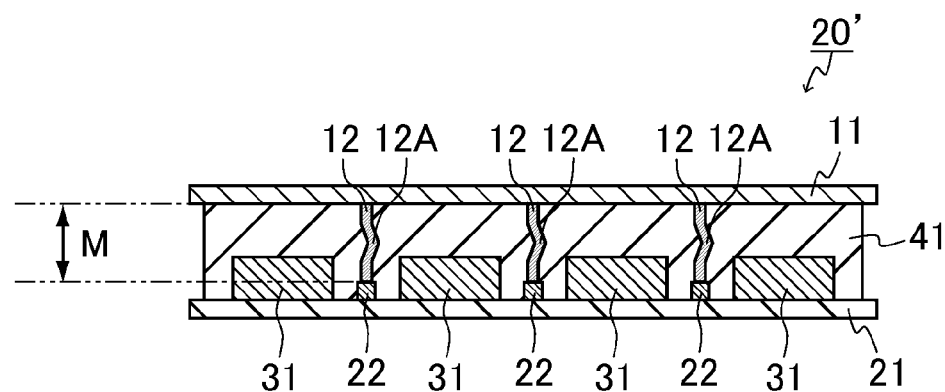
Figure 5:
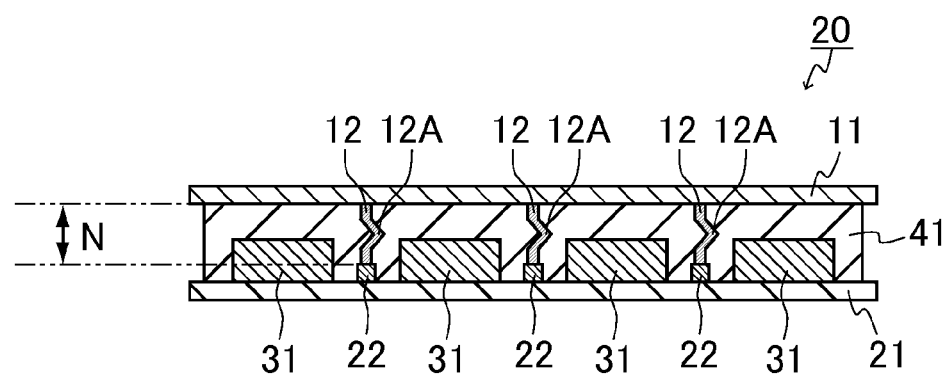

The cross-sectional views of (A) to (C) in FIG. 5 schematically shows an example of the production step of an electronic component using the bump-formed plate-like member in FIGS. 1A and 1B. The cross-sectional view of (C) in FIG. 5 is a schematic view of the structure of the electronic component according to the present example produced by the production step. First, as shown in (C) in FIG. 5, this electronic component 20 includes: a substrate 21; chips 31, a resin 41, a plate-like member 11, and bumps 12 each having a deformable portion 12A. The bumps 12 are formed on the plate-like member 11, and the plate-like member 11 and the bumps 12 are integrated to form a bump-formed plate-like member. The chips 31 are formed on the substrate 21 and are encapsulated in the resin 41. A wiring pattern 22 is formed on a side of the substrate 21, on which the chips 31 are arranged. As also described in FIGS. 1A and 1B, the bumps 12 are formed on the plate-like member 11. Moreover, the bumps 12 are in contact with the wiring pattern 22 through the resin 41.

The production step of (A) to (C) in FIG. 5 is described below. First, as shown in (A) in FIG. 5, a bump-formed plate-like member 10 and a substrate 21 are provided. As shown in (A) in FIG. 5, in the bump-formed plate-like member 10, bumps 12 are formed on a plate-like member 11, and the plate-like member 11 and the bump(s) 12 are integrated to form the bump-formed plate-like member 10. In (A) in FIG. 5, the length (height) of the bumps 12 in the direction perpendicular to the plane direction of the plate-like member 11 is indicated by an arrow and a character M. The chips 31 are formed on the substrate 21. The wiring pattern 22 is formed on the side of the substrate 21, on which the chips 31 are arranged. Then, the bump-formed plate-like member 10 and the substrate 21 are arranged so that the bump 12-formed surface and the wiring pattern 22-formed surface are faced with each other as shown in (A) in FIG. 5.

Then, as shown in (B) in FIG. 5, the chips 31 are encapsulated in the resin 41 between the bump 12-formed surface of the plate-like member 11 and the wiring pattern 22-formed surface of the substrate 21 to form an electronic component 20'. In (B) in FIG. 5, the bumps 12 each having the deformable portion 12A are not shrunk. That is, the length (height) of the bumps 12 in the direction perpendicular to the plane direction of the plate-like member 11 remains M that is the same as in (A) in FIG. 5. In this state, the bumps 12 are in contact with the wiring pattern 22, and when the length of the bumps 12 suits on the predetermined thickness of the electronic component, the electronic component 20' in this state may be regarded as a completed electronic component. When the length of the bumps 12 does not suit on the predetermined thickness of the electronic component, the electronic component 20' is not a completed product. Thus, in order to cause the length of the bumps 12 to suit on the predetermined thickness of the electronic component, the distance between the plate-like member 11 and the substrate 21 is reduced by pressing the electronic component 20' in the direction perpendicular to the plane direction of the plate-like member 11. At that time, a pressure force is applied to the bumps 12 by a contact with the wiring pattern 22 of the substrate 21. By this pressure force, the entire bumps 12 are relatively pressed in the direction perpendicular to the plane direction of the plate-like member 11. By this pressure, as shown in (C) in FIG. 5, the deformable portion 12A of each of the bumps 12 is bent, and thus, the bumps 12 are shrunk in the direction perpendicular to the plane direction of the plate-like member 11. That is, as shown in (C) in FIG. 5, the length (height) of the bumps 12 in the direction perpendicular to the plane direction of the plate-like member 11 becomes N which is a numerical value smaller than M in (A) and (B) of FIG. 5 (M>N). Accordingly, the length of the bumps 12 suits on the predetermined thickness of the electronic component (distance between the plate-like member 11 and the substrate 21). In the state of (C) in FIG. 5, the bumps 12 are in the state of being in contact with the wiring pattern 22. The completed electronic component 20 shown in (C) in FIG. 5 can be produced as described above. In FIG. 5, as a matter of convenience of description, the description is made regarding the bumps 12 as bumps each having a zigzag deformable portion 12A. However, as mentioned above, the shape of the bumps 12 is not limited to this and may be any shape as mentioned above. Hereinafter, the same applies to all of cross-sectional views including bumps 12.

The plate-like member 11 is not limited to particular members and may be, for example, as mentioned above, a heat radiation plate or a shield (shield plate). For example, in the case where plural chips (electronic component before resin-encapsulation) are arranged in one IC (electronic components being chips encapsulated in a resin), each chip may be electromagnetically shielded with a shield (shield plate) based on the relationship among functions of the chips.

Moreover, although the bump-formed plate-like member may be a plate-like member corresponding to one substrate (one electronic component), it may be a (matrix-type) plate-like member corresponding to plural substrates (plural electronic components) as shown in FIGS. 1A and 1B. In the case of the matrix type, for example, plural substrates on each of which a chip(s) and a wiring pattern are fixed are subjected to resin-encapsulation together with the matrix-type bump-formed plate-like member. The matrix-type bump-formed plate-like member may thereafter be partitioned into regions corresponding to the respective substrates by cutting or the like. Moreover, for example, as mentioned above, at least one bump may be a plate-like bump. In this case, a required area (an area having a specific function) corresponding to one electronic component (one product unit) on the surface of the substrate can be partitioned (divided) with the plate-like bump.

Moreover, as substitute for the chips 31, resin-encapsulated electronic components may be used. In this case, the electronic component 20 is in a form in which the chips 31 have been further subjected to resin-encapsulation. Thus, chips are subjected to resin-encapsulation plural times.

Figure 6:
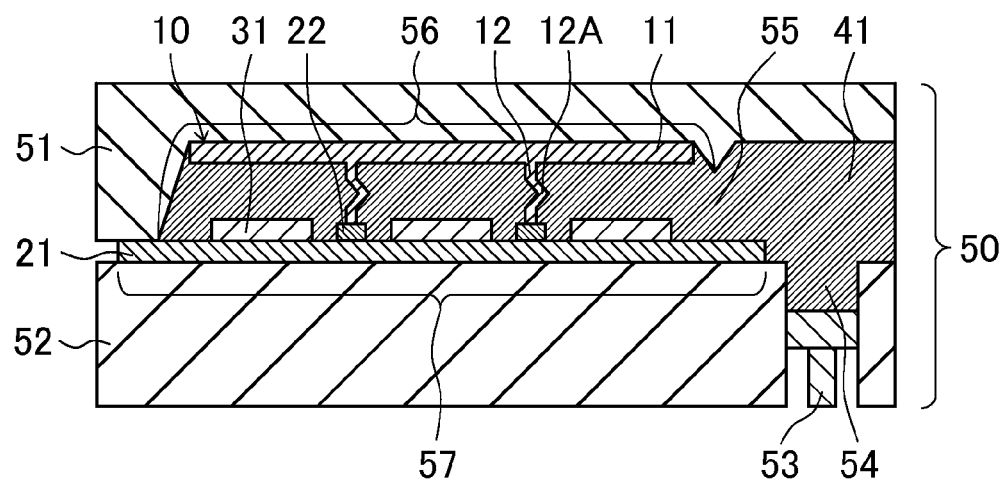
FIG. 6 is a cross-sectional view showing, as an example, the production method according to the present invention using transfer molding.

An example of a method for producing an electronic component shown in FIG. 5 is schematically shown in the cross-sectional view of FIG. 6. This production method is, as mentioned above, a production method using transfer molding.

As shown in FIG. 6, this production method can be performed using a molding die 50 for general transfer molding. As shown in FIG. 6, the molding die 50 is formed of an upper die 51 and a lower die 52. The molding die is configured so that the die surface of the upper die 51 is provided with a die cavity 56 for resin molding, and the die surface of the lower die 52 is provided with a substrate set part 57 that supplies and sets a substrate 21 that is provided with chips 31 and a wiring pattern 22.

The lower die 52 is provided with a pot (hole) 54 for supplying a resin material, and a plunger 53 for resin pressurization is fit into the pot.

The method for transfer molding using the device shown in FIG. 6 is not limited to particular methods, and transfer molding may be performed according to a general method for transfer molding. That is, the method is configured as follows. First, a resin material such as a resin tablet is supplied to the pot 54, the substrate 21 is supplied and set in the substrate set part 57, and both of the upper die 51 and the lower die 52 are clamped. At that time, as shown in FIG. 6, the bumps 12 are shrunk in the direction perpendicular to the plane direction of the plate-like member 11 by bending the deformable portion 12A. Accordingly, the length of the bumps 12 suits on the predetermined thickness of the resin-encapsulated component. Subsequently, the resin is heated and melted in the pot 54, and a molten resin 41 in the pot 54 is pressurized by moving the plunger 53 upward to cause the molten resin to pass through the resin passage (cull, runner, gate) 55 from the pot 54 of the lower die 52 so that the molten resin can be injected into the die cavity 56 of the upper die 51. At that time, a required resin pressure can be applied to the resin in the die cavity 56 by the plunger 53.

After the elapse of time required to cure, the upper die 51 and the lower die 52 are unclamped, so that the chips 31 and the like can be encapsulated and molded in the package (resin molded article) having a shape corresponding to the shape of the cavity in the mold cavity 56 (see the electronic component 20 shown in FIG. 5).

In the present example, the production method shown in FIG. 6 (production of the electronic component 20 shown in FIG. 5) can be performed as described below, for example. That is, first, a substrate 21 provided with chips 31 and a wiring pattern 22 is arranged at a position corresponding to the position of a die cavity of the upper die 51 on the die surface (substrate set part) of a lower die 52. Then, a plate-like member 11 and bumps 12 are arranged thereon so as to be at the same position as the completed electronic component 20 (FIG. 5). At that time, as shown in FIG. 6, the surface of the substrate 21, opposite to the chip 31-arranged surface, is caused to be in contact with the lower die 52, so that a bump-formed plate-like member (the plate-like member 11 and the bumps 12) is placed on the chip 31-arranged surface, and the wiring pattern 22 is physically electrically connected to the tips of the bumps 12.

The substrate 21, the chips 31, the plate-like member 11, and the bumps 12 may be placed on the die surface of the lower die 52 in the state of being upside down in FIG. 6. That is, the surface of the plate-like member 11, opposite to the bump 12-formed surface, may be caused to be in contact with the lower die 52, and the substrate 21 and the chips 31 may be arranged on the bump 12-formed surface.

Subsequently, as shown in FIG. 6, the upper die 51 and the lower die 52 are clamped. At that time, the upper die 51 is placed on the lower die 52, and the substrate 21, the chips 31, the plate-like member 11, and the bumps 12 are contained in the die cavity of the upper die, and the plate-like member 11 comes into contact with the upper surface of the die cavity. At that time, as mentioned above, in the process of clamping, the deformable portion 12A of each of the bumps 12 is bent. Thus, the bumps 12 are shrunk in the direction perpendicular to the plane direction of the plate-like member 11. Thus, the length of the bumps 12 suits on the thickness of the electronic component.

In this state, as shown in FIG. 6, a resin 41 is injected from the pot 54 of the lower die 52 into the die cavity of the upper die 51 through the resin passage 55 by the plunger 53. Thus, the chips 31 arranged on the substrate 21 are subjected to resin-encapsulation together with the plate-like member 11 and the bumps 12. Accordingly, the electronic component 20 shown in FIG. 5 can be produced.

At the time of injecting the resin into the die cavity 56, in the die cavity 56, the resin (molten resin) 41 can flow between the bumps 12 and can pass through the holes 12b of the bumps 12.

Although the method in which clamping is performed after placing both of the substrate and the bump-formed plate-like member on the die surface of the lower die is described above, the present invention is not limited thereby. For example, the substrate 21 may be supplied to and set on the die surface of the lower die 52, the bump-formed plate-like member (plate-like member 11) may be attached to the upper surface of the die cavity of the upper die 51, the upper die 51 and the lower die 52 may be clamped, and the resin may be injected into the die cavity. At that time, as mentioned above, the plate-like member 11 and the substrate 21 may be upside down.

At the time of molding (resin-encapsulation) in transfer molding, for example, the transfer molding may be performed with setting of the degree of vacuum in the die cavity to the predetermined degree. The method for setting the degree of vacuum to the predetermined degree is not limited to particular methods and may be, for example, performed according to the method in general transfer molding.

A device for use in the transfer molding is not limited to particular devices and may be, for example, the same as a general device for transfer molding. Specific conditions of the encapsulating are not limited to particular methods and may be, for example, the same as those in general transfer molding.

In order to connect between the bumps 12 and the wiring pattern 22 more securely, solders may be arranged between the bumps 12 and the wiring pattern 22 in advance. In this case, for example, the solders may be melted by reflow or the like after the encapsulating to join the bumps 12 and the wiring pattern 22. The same applies to the following examples.

According to the present invention, it is not required to design the height of the bumps according to the thickness. Thus, an electronic component having both of a via electrode(s) (bump(s)) and a plate-like member can be produced simply and efficiently.

According to the present invention, it is not required to bore a hole for via formation (a groove or a hole) in the resin as described above. Thus, for example, the following effects (1) to (5) can be obtained. These effects, however, are mere examples and does not limit the present invention.

(1) There is no possibility that the depth and the like of a hole for via formation are not correctly appropriately formed on a wiring pattern of a substrate due to variations in thickness of the resin-encapsulated electronic component (package) and the like because it is not required to bore a hole for via formation in the resin.

(2) Fillers contained in a resin material do not remain on a wiring pattern of a substrate because it is not required to bore a hole for via formation in the resin.

(3) Damage is not caused to a wiring pattern on a chip-mounted substrate because it is not required to bore a hole for via formation in the resin.

(4) The conditions under which an electronic component is produced are not influenced by the filler density of the resin material because it is not required to bore a hole for via formation in the resin.

(5) By the effects (1) to (4), an electronic component can be simply and efficiently produced, and a yield is favorable. Moreover, a connection between the wiring pattern on the substrate and the bump(s) (via electrode(s)) and the like becomes favorable, which contributes to an improvement in performance of the electronic component, a reduction in defect rate, or the like.

Example 2

In FIGS. 7 to 10, another example of the present invention is described with reference to FIGS. 7 to 10. In the present example, an example of a method for producing an electronic component using compression molding is described. Each of bumps of a bump-formed plate-like member used in the present example has a deformable portion.

Figure 7:
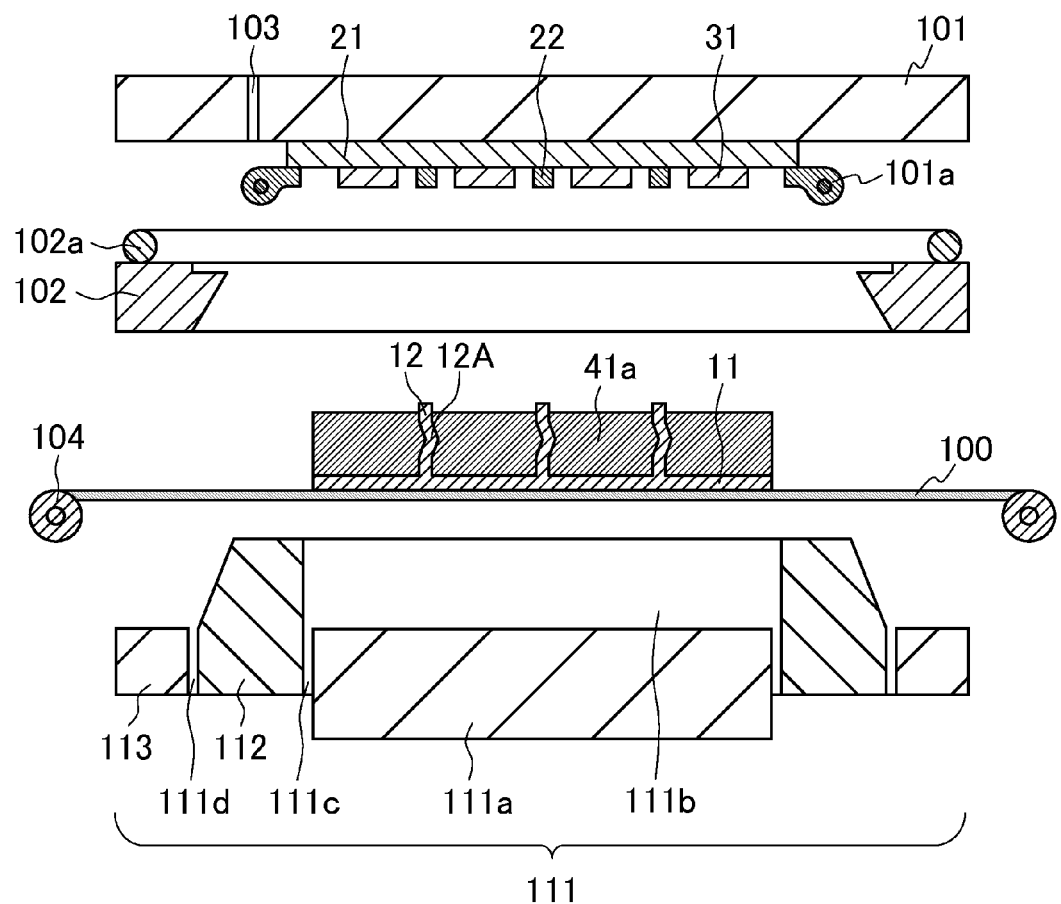
FIG. 7 is a cross-sectional view showing, as an example, a step in an example of the production method according to the present invention using compression molding.

First, a compression molding device (a device for producing an electronic component) is provided. The step cross-sectional view of FIG. 7 shows the structure of a part of a molding die that is a part of the compression molding device. As shown in FIG. 7, this compression molding device includes, as main components, an upper die 101, a lower die 111, and an intermediate die (intermediate plate) 102. The lower die 111 includes a lower die cavity bottom member 111a and lower-die peripheral members (main body of the lower die) 112 and 113. The lower-die peripheral members (main body of the lower die) 112 and 113 are frame-shaped lower die cavity side members. More specifically, the lower-die peripheral member 112 is arranged so as to surround the periphery of the lower die cavity bottom member 111a, and the lower-die peripheral member 113 is arranged so as to surround the periphery of the lower-die peripheral member 112. There is a gap (adsorption hole) 111c between the lower die cavity bottom member 111a and the lower-die peripheral member 112. There is a gap (adsorption hole) 111d between the lower-die peripheral members 112 and 113. These gaps 111c and 111d are evacuated with a vacuum pump (not shown) as mentioned below, and thus a release film and the like can be adsorbed. The height of the upper surface of the lower-die peripheral member 112 is higher than the heights of the upper surfaces of the lower die cavity bottom member 111a and a lower-die peripheral member 113. Thus, a lower die cavity (concave portion) 111b surrounded by the upper surface of the lower die cavity bottom member 111a and the inner peripheral surface of the lower-die peripheral member 112 is formed. The upper die 101 has a hole (through hole) 103. As mentioned below, at least the lower die cavity 111b can be evacuated by suction from the hole 103 with a vacuum pump (not shown) after clamping. The intermediate die (intermediate plate) 102 has a frame shape (ring shape) and is arranged so as to be positioned immediately above the lower-die peripheral member 113. A release film 100 can be held between the lower surface of the intermediate die 102 and the upper surface of the lower-die peripheral member 113, so that the release film 100 can be fixed. An O ring 102a having elasticity is attached to an outer edge in the upper surface of the inner mediate die 102. As shown in FIG. 7, this compression molding device has rolls 104 on both sides in FIG. 7. Both ends of one long release film 100 are wound onto the rolls 104 on the both sides. The release film 100 can be delivered from right to left or from left to right in FIG. 7 by the rolls 104 on the both sides. Thus, as mentioned below, the bump-formed plate-like member can be transferred to the position of the lower die cavity in the state where the bump-formed plate-like member is placed on the release film 100. That is, the rolls 104 correspond to transfer means for transferring the bump-formed plate-like member to the position of a die cavity in a molding die. This compression molding device (device for producing an electronic component) further includes a resin placement means, although it is not shown. The resin placement means causes a resin to be placed on the bump-formed surface of the bump-formed plate-like member.

Subsequently, as shown in FIG. 7, a substrate 21 fixed on one surfaces of chips 31 is fixed on the lower surface of the upper die 101 by a clamper 101a. At that time, the fixation is performed so that the chip 31-fixed surface of the substrate 21 faces downward. The substrate 21 and the chips 31 are the same as those in Example 1, and a wiring pattern 22 is formed in the substrate 21 as in Example 1. Further, by the resin placement means, as shown in FIG. 7, a resin material (resin) 41a is placed on the bump 12-formed surface of a plate-like member 11 (placing the resin). The plate-like member 11, the bumps 12, and the resin material 41a are the same as those in Example 1. Although the form of the resin material 41a is not limited to particular forms, it is preferred that the resin material 41a is not fallen from the bump 12-formed surface of the plate-like member 11 in the placing the resin. For example, in the placing the resin, a sheet-like resin material 41a may be laminated and pressed on the bump 12-formed surface of the plate-like member 11. Moreover, as shown in FIG. 7, the plate-like member 11 on which the resin material 41a is placed is placed on the release film 100. At that time, as shown in FIG. 7, the placement is performed so that the resin material 41a-placed surface (the bump 12-formed surface) of the plate-like member 11 faces upward (i.e., the surface opposite to the bump 12-formed surface is in contact with the upper surface of the release film 100). A pressure-sensitive adhesive (adhesive layer) may be present between the upper surface of the release film 100 and the plate-like member 11, and the plate-like member 11 may be fixed on the upper surface of the release film 100 by the pressure-sensitive adhesive (adhesive layer), although it is not shown. As described above, the presence of the pressure-sensitive adhesive (adhesive layer) is preferable because there is an advantage in that the resin material 41a is less prone to be leaked from the hole 13 even in the case where the plate-like member 11 has the hole 13 as shown in FIG. 1B and the like, for example. Furthermore, as shown in FIG. 7, the resin material 41a is transferred to the position of the lower die cavity 111b together with the plate-like member 11, the bumps 12, and the release film 100 by the transfer means.

Figure 8:
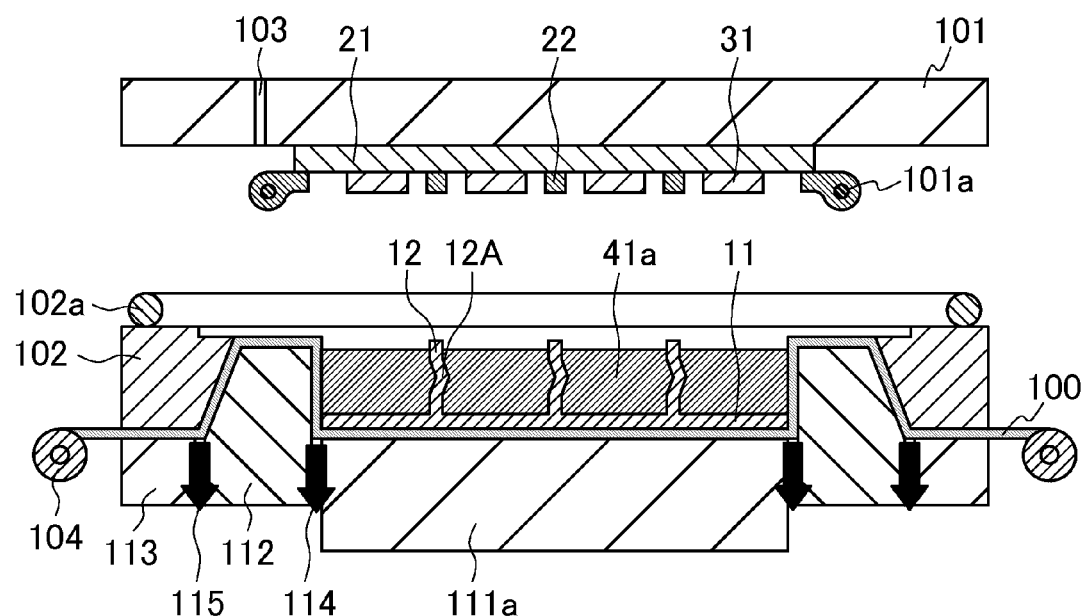
FIG. 8 is a cross-sectional view showing, as an example, another step in the same production method as in FIG. 7.

Subsequently, as shown in an arrow 114 of FIG. 8, a space (gap 111c) between the lower die cavity bottom member 111a and the lower-die peripheral member 112 is evacuated with a vacuum pump (not shown). Along with the evacuation, as shown in an arrow 115 of FIG. 8, a space (gap 111d) between the lower-die peripheral member 112 and the lower-die peripheral member 113 is evacuated with a vacuum pump (not shown). Moreover, the intermediate die 102 is caused to move downward together with the O ring 102a, and the release film 100 is held between the lower surface of the intermediate die 102 and the upper surface of the lower-die peripheral member 113. Thus, the release film 100 is fixed on the upper surfaces of the lower-die peripheral member 112 and the lower-die peripheral member 113. The surface of the lower die cavity 111b can be covered with the release film 100 by the evacuation indicated by the arrow 114 of the lower die cavity 111b. Thus, as shown in FIG. 8, the resin material 41a can be placed on the surface of the lower die cavity in the state where the resin material 41a is placed on the plate-like member 11.

Figure 9:
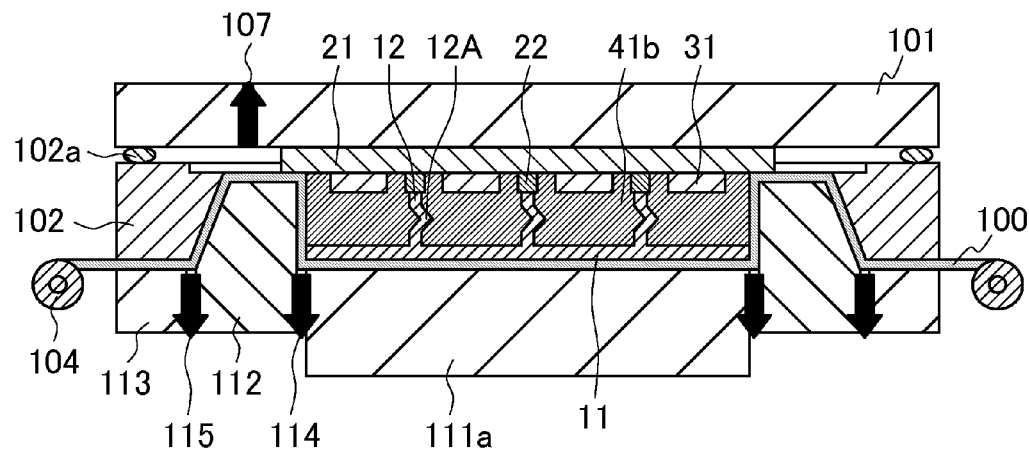
FIG. 9 is a cross-sectional view showing, as an example, yet another step in the same production method as in FIG. 7.
Figure 10:
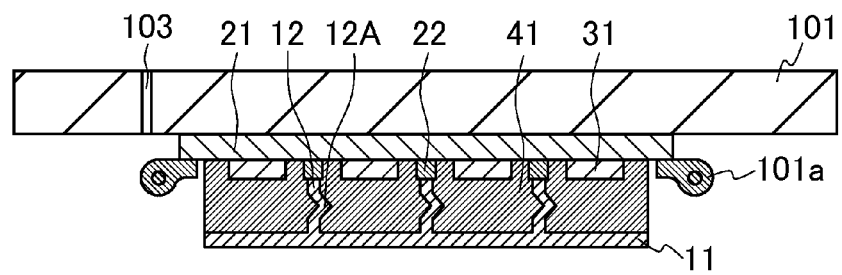
FIG. 10 is a cross-sectional view showing, as an example, yet another step in the same production method as in FIG. 7.
Figure 10:
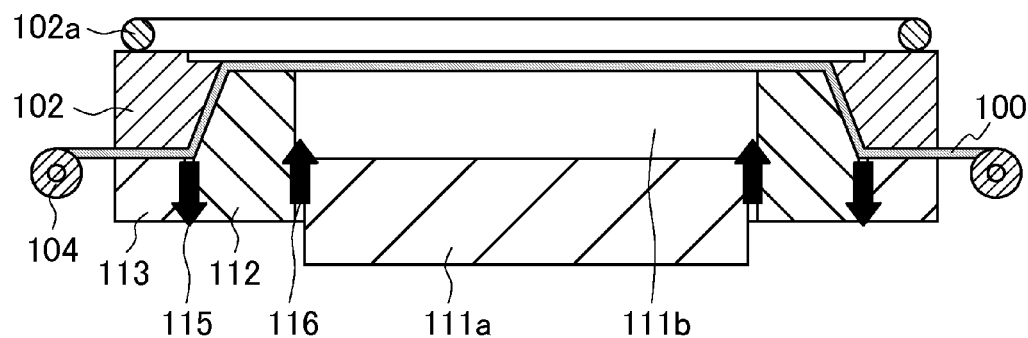

Next, the encapsulating is performed as shown in FIGS. 9 and 10. In FIG. 9, illustration of a clamper 101a is omitted as a matter of convenience.

That is, first, as shown in FIG. 9, a lower die 111 (lower die cavity bottom member 111a and lower-die peripheral members 112 and 113) is lifted together with an intermediate die 102 and an O ring 102a for exclusion of outside air. At that time, by joining the die surface of an upper die 101 and an upper surface side of the O ring 102a, the inside of at least the lower die cavity 111b can be set in the state of excluding outside air, and an outside air-excluding space can be formed in each of the upper die, the lower die, and the intermediate die (three dies). In this state, as shown in an arrow 107, at least the lower die cavity 111b (outside air-excluding space) is subjected to suction through a hole 103 of the upper die 101 with a vacuum pump (not shown) to evacuate. Furthermore, the lower die 111 and the intermediate die 102 are integrally lifted. At that time, the upper surface of the lower-die peripheral member 112 (lower die 111) and the surface of the substrate 21 can be joined via a release film 100.

Subsequently, the lower die cavity bottom member 111a is lifted. At that time, as shown in FIG. 9, a resin material (resin) 41a is caused to be in the state of being a flowable resin (resin) 41b. Therefore, first, the chips 31 can be immersed in the flowable resin 41b in the lower die cavity 111b, and then, the flowable resin 41b in the lower die cavity 111b can be pressurized by the lower die cavity bottom member 111a. Accordingly, as shown in FIG. 10, the chips 31 (including bumps and a wiring pattern 22) attached to the substrate 21 in the lower die cavity 111b can be subjected to compression molding (resin-molding) in an encapsulation resin (resin) 41 composed of a curable resin and can be a molded package (resin molded article) corresponding to the shape of the lower die cavity 111b. At that time, the plate-like member 11 is in the state of being attached to the upper surface side of the molded package 41, opposite to the substrate 21. At that time, there may be a small clearance (gap) between the substrate 21 and the release film 100.

As mentioned above, as shown in the arrow 107, at least the lower die cavity 111b is subjected to suction through the hole 103 of the upper die 101 with a vacuum pump (not shown) to evacuate. Then, in the state, the flowable resin 41b is subjected to compression molding together with the plate-like member 11, the bumps 12, the chips 31, and the substrate 21 to perform resin-encapsulation of the chips 31. At that time, the entire bumps 12 are relatively pressured in the perpendicular direction by the pressure force caused by causing the bumps 12 come into contact with the wiring pattern 22 of the substrate 21. By the pressure, as shown in FIG. 9, the flowable resin 41b of each of the bumps 12 designed to have a thickness higher than the flowable resin 41b is bent. Accordingly, the bumps 12 is shrunk in the direction perpendicular to the plane direction of the plate-like member 11 (i.e., the length in the direction perpendicular to the plane direction is reduced), and the length of the bumps 12 suits on the predetermined thickness of the resin-encapsulated component. At that time, the bumps 12 are caused to be in contact with the wiring pattern 22 formed on the substrate 21. Furthermore, the flowable resin 41b is cured to be an encapsulation resin (resin) 41 composed of a curable resin as shown in FIG. 10. An electronic component can be produced by performing the "encapsulating" as described above.

As mentioned above, when the chips 31 are immersed in the resin 41 that is in the lower die cavity 111b, the resin is in the state of being a flowable resin 41b. The flowable resin 41b may be, for example, a liquid resin (thermosetting resin or the like before being cured) or a resin in the molten state obtained by heating a solid resin such as a granular resin, a powdery resin, or a resin paste to melt. The resin material 41a can be heated through heating the lower die cavity bottom member 111a or the like, for example. For example, in the case where the resin material 41a is a thermosetting resin and has flowability (i.e., in the state of being a flowable resin 41b), the resin material 41a (flowable resin 41b) in the lower die cavity 111b may be heated and then thermally cured by pressurization. Thus, resin-encapsulation molding (compression molding) of the chips 31 can be performed in the resin molded article (package) corresponding to the shape of the lower die cavity. As described above, for example, the resin-encapsulation molding can be performed in the state where the plate-like member 11 is exposed to the upper surface (the surface on the side opposite to the substrate) of the resin molded article (package).

After the compression molding (resin-encapsulation), i.e., forming an encapsulation resin 41 by curing the flowable resin 41b, the lower die cavity 111b through the hole 103 of the upper die 101 is released from being evacuated (arrow 107 in FIG. 9). Subsequently, as shown in FIG. 10, the lower die 111 (lower die cavity bottom member 111a and lower-die peripheral members 112 and 113) is caused to move downward together with the intermediate die 102 and the O ring 102a. At that time, the depressurization (evacuation) of the gap between the lower die cavity bottom member 111a and the lower-die peripheral member 112 may be released. As shown in an arrow 116, air may be delivered to the gap. Accordingly, as shown in FIG. 8, the release film 100 is separated from the upper surface of the lower die cavity bottom member 111a. At that time, the depressurization (evacuation) of the gap between the lower-die peripheral members 112 and 113 is not released. Moreover, the intermediate die 102 still holds the release film 100 together with the lower-die peripheral member 113. Therefore, the release film 100 is, as shown in FIG. 10, continuously adsorbed to (fixed on) the upper surfaces of the lower-die peripheral members 112 and 113. Moreover, the substrate 21 is continuously fixed on the lower surface (die surface) of the upper die 101 by a clamper 101a. Then, the resin 41 and the plate-like member 11 are subjected to compression molding together with the substrate 21 and the chips 31. Thus, the release film 100 is removed from the electronic component formed of the substrate 21, the plate-like member 11, the bumps 12, the chips 31, and the resin 41 by causing the lower die 111 to move downward. Subsequently, by the rolls 104, the release film 100 is unreeled (or reeled) in the right or left direction of FIG. 10.

In the present invention, for example, as shown in the present example, when resin-encapsulation of chips is performed, the entire bumps 12 are present in the flowable resin 41b (a molten resin or a liquid resin) in the lower die cavity 111b. In this state, as mentioned above, when the lower die cavity bottom member 111a is moved upward, the tips of the bumps 12 and the wiring pattern 22 of the substrate 21 physically come into contact with each other and are connected to each other in the flowable resin 41b. Thus, for example, the tips of the bumps and the wiring pattern of the substrate can be easily connected to each other without causing the resin to enter between them, compared with the method in which a hole for via formation is bored after the resin-encapsulation of the chips. That is, there is an advantage in that the bumps and the wiring pattern of the substrate are prone to be electrically connected to each other. This is advantageous in view of shielding performance in the case where the plate-like member is a shield plate, for example. For example, as substitute for or in addition to bending the zigzag deformable portion, as shown in (A) to (D) in FIGS. 3 and (A) to (D) in FIG. 4, the bumps 12 may be capable of being shrunk (the height may be capable of being reduced). That is, even when the heights of the bumps 12 are slightly higher than the thickness of the resin 41, it is possible to shrink the bumps 12 by elastically moving the projection 12c to the gap on the hole 12b side (downward) in the case where the tip of the projection 12c comes into contact with the wiring pattern 22. Thus, as mentioned above, the heights of the bumps 12 can be adjusted according to the thickness of the resin (the thickness of the package) in the electronic component.

Figure 11:
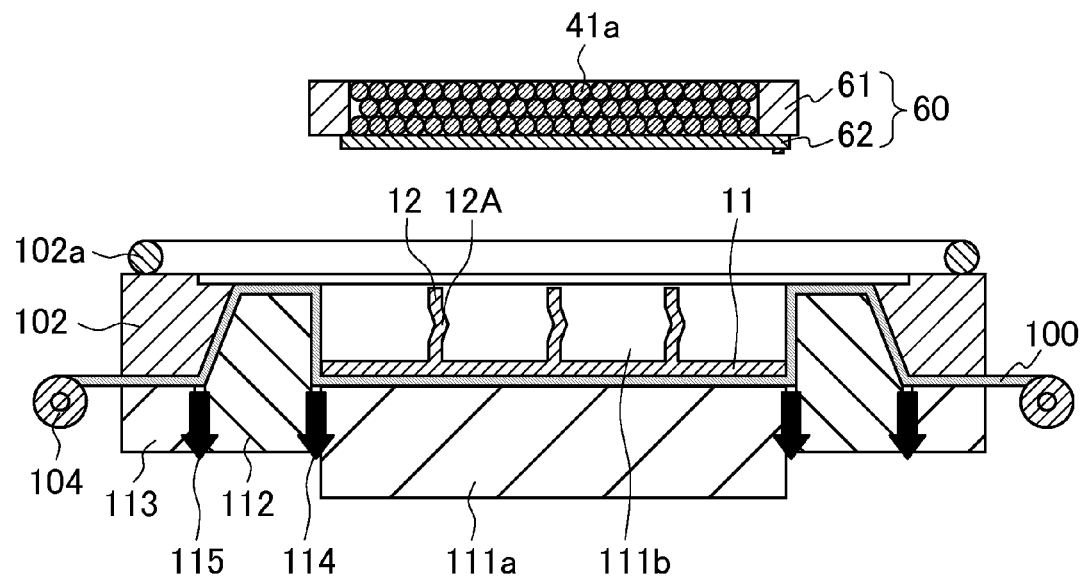
FIG. 11 is a cross-sectional view showing, as an example, a step in another example of the production method according to the present invention using compression molding.
Figure 12:
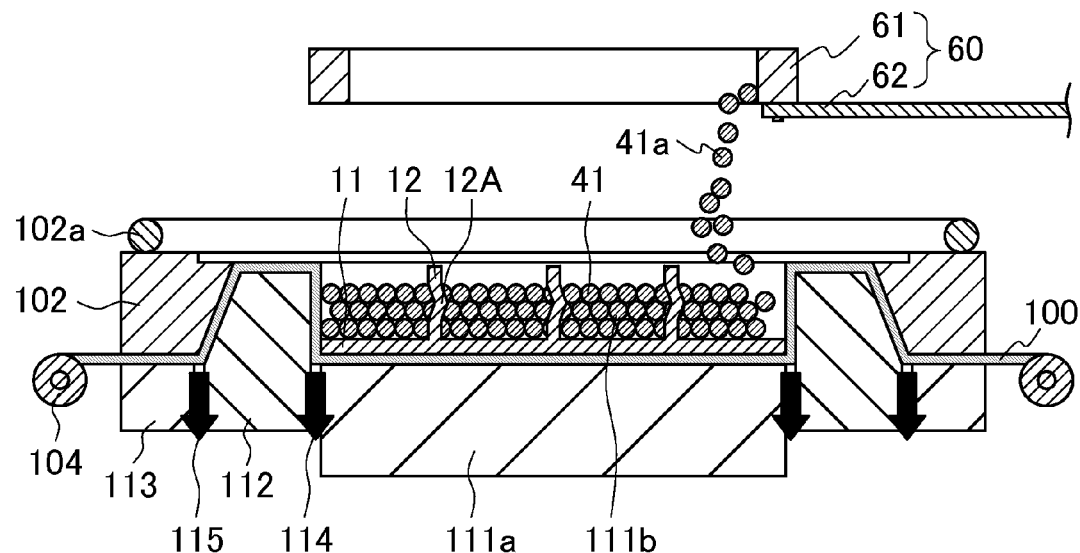
FIG. 12 is a cross-sectional view showing, as an example, another step in the same production method as in FIG. 11.
Figure 13:
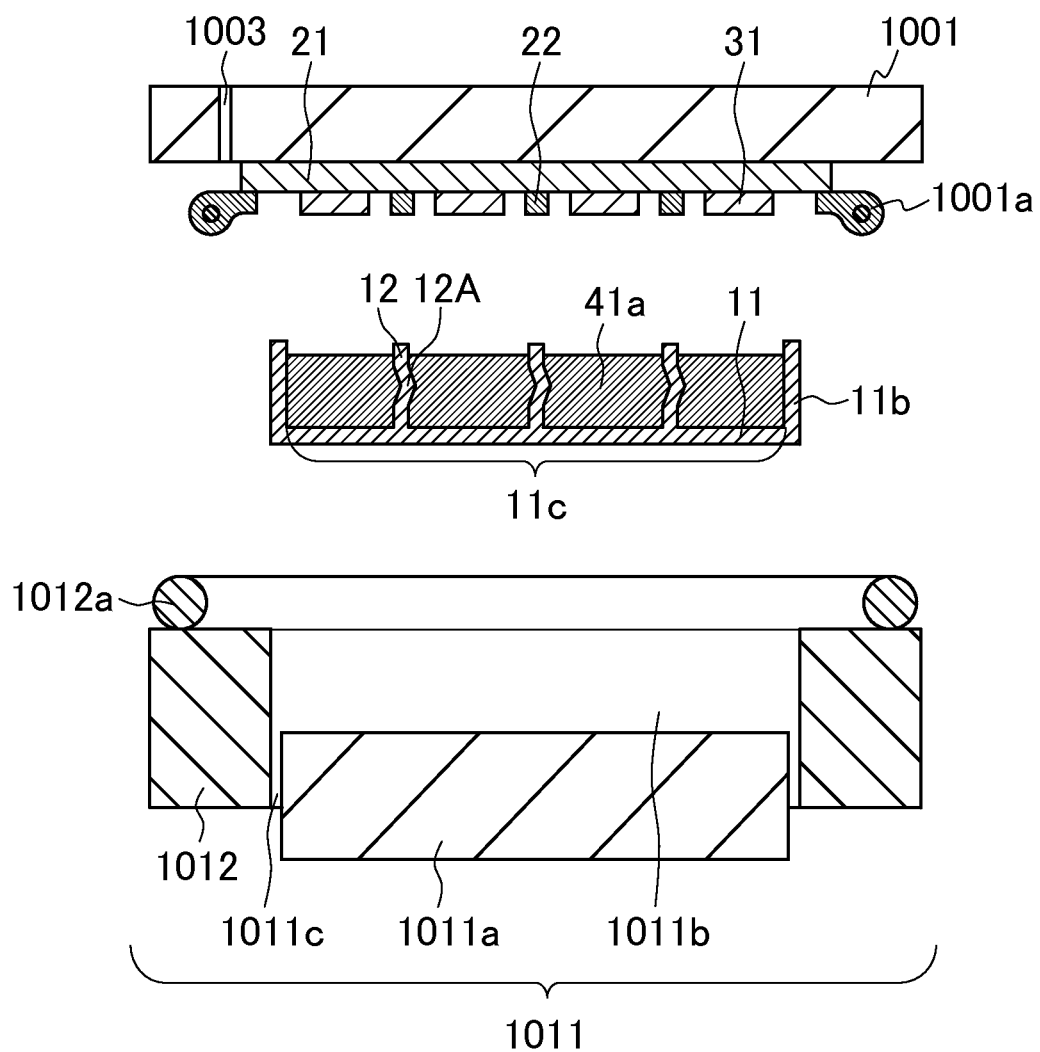
FIG. 13 is a cross-sectional view showing, as an example, a step in yet another example of the production method according to the present invention using compression molding.

Next, FIGS. 11 and 12 are described. The method in which placing a resin 41 on a plate-like member 11 is performed, and thereafter transferring a bump-formed plate-like member to a die cavity is described above with reference to FIGS. 7 to 10. As mentioned above, the order of performing the placing the resin and the transferring the bump-formed plate-like member, however, is not limited to particular orders. Each of FIGS. 11 to 12 shows an example of a method for producing an electronic component, including performing the placing the resin after the transferring the bump-formed plate-like member. As shown in FIGS. 9 to 10, a compression molding device (device for producing an electronic component) for use in this method is the same as the compression molding device (device for producing an electronic component) shown in FIGS. 7 to 10 except for having a resin supply means 60. In FIGS. 11 to 12, illustration of an upper die 101, a hole (through hole) 103 in the upper die, a clamper 101a, a substrate 21, a wiring pattern 22, and chips 31 are omitted for simplifying the drawings. As shown in FIGS. 11 and 12, the resin supply means 60 is composed of a resin supply section 61 and a lower shutter 62. The resin supply section 61 has a frame shape in which openings are formed at the upper end and the lower end. The opening at the lower end of the resin supply section (frame) 61 is closed with the lower shutter 62. Thus, as shown in FIG. 11, a resin material 41a can be contained in a space surrounded by the resin supply section (frame) 61 and the lower shutter 62. In this state, as shown in FIG. 11, the resin supply means 60 is caused to enter immediately above a lower die cavity 111b (space between a lower die 111 and an upper die 101). Then, as shown in FIG. 12, the opening at the lower end of the resin supply section (frame) 61 is opened by pulling the lower shutter 62 to cause the resin material 41a to move downward from the opening. Thus, the resin material 41a can be supplied to (placed in) the lower die cavity 111b. Although the resin material 41a is a granule resin in FIGS. 11 and 12, the resin 41 is not limited to particular resins. In the placing the resin prior to the steps in FIGS. 7 to 10, the rein supply means 60 composed of the resin supply section 61 and the lower shutter 62 may be used as in FIGS. 11 to 12.

In the method shown in FIGS. 11 to 12, first, the same step as in FIGS. 7 to 8 is performed in the transferring the bump-formed plate-like member except that the resin material 41a is not placed on the plate-like member 11. Thus, as shown in FIG. 11, a bump-formed plate-like member (plate-like member 11 and bumps 12) is placed on the cavity surface of the lower die cavity 111b (via a release film 100) in the same state as in FIG. 8 except that the resin material 41a is not placed on.

Then, prior to the placing the resin, the bump-formed plate-like member is heated in the lower die cavity in the state shown in FIG. 11 (heating). The heating can be performed by heating a lower die cavity bottom member 111a or the like. It is preferred that the bump-formed plate-like member is subjected to sufficient thermal expansion in this heating. That is, it is preferred that the bump-formed plate-like member is not expanded by heating in encapsulating performed later. Thus, in the encapsulating, positions of the bumps 12 and the wiring pattern 22 are less prone to be deviated, and the positions are easily aligned.

Furthermore, as shown in FIG. 12, in the lower die cavity 111b, the resin material 41a is placed on the bump 12-formed surface of the plate-like member 11 (placing the resin). In this placing, for example, the opening at the lower end of the resin supply section (frame) 61 is opened by pulling the lower shutter 62 to cause the resin material 41a to move downward from the opening, and thus, the resin material 41a is supplied to (placed in) the lower die cavity 111b. Thereafter, the encapsulating is performed as in FIGS. 9 to 10. Although the resin material 41a is a granule resin in FIG. 12, the resin material 41a is not limited thereto. For example, the resin material 41a may be a thermoplastic resin (e.g., a granule resin, a powder resin), and may be melted by the heat of the bump-formed plate-like member to be a flowable resin 41b, and then, the flowable resin 41b may be solidified by cooling. As mentioned above, the resin material 41a may be a liquid thermosetting resin before being cured and may be cured by the heat of the bump-formed plate-like member.

In the present example, the structure of the compression molding device is not limited to the structure shown in FIGS. 7 to 10, may be any structure, and may be the same as the structure of a general compression molding device, for example. Specifically, the structure of the compression molding device may be the same as or according to any of the structures shown in JP 2013-187340 A, JP 2005-225133 A, JP 2010-069656 A, JP 2007-125783 A, JP 2010-036542 A, and the like, for example. For example, the structure of the compression molding device may be the same structure as in FIGS. 2 to 6 of JP 2013-187340 A (structure in which a film retainer is attached to the upper die as substitute for having no intermediate die) as a substitute for the structure shown in FIGS. 7 to 10. A compressing molding method using such compression molding device (method for producing an electronic component) can be performed in the same manner as described in JP 2013-187340 A, for example. The resin supply means may have any alternative configuration to the resin supply means 60 shown in FIGS. 11 and 12. For example, the resin supply means may be a resin material distribution means (including a resin material introduction means, a measurement means, a hopper, a linear oscillatory feeder, and the like) described in JP 2010-036542 A. The resin supply means may have a configuration including a storage section, a measurement section, an introduction section, a supply section, a shutter, a tray, a slit, and the like as in a resin supply mechanism described in JP 2007-125783 A. For example, an upward-and-downward motion mechanism of a lower die and the like that are not shown in FIGS. 7 to 10 may be the same as or according to JP 2005-225133 A, JP 2010-069656 A, or the like, and for example, an elastic member may be connected to the lower part of the lower die cavity bottom member.

In the present example, a method in which compression molding is performed by evacuating the lower die cavity is used. The present invention, however, is not limited thereto, and another compression molding may be used.

The production method of the present invention is, as mentioned above, the production method including the encapsulating and may include any of other steps as shown in the present example.

In the present example, as mentioned above, the bump-formed plate-like member is placed on the release film, and in the state, the bump-formed plate-like member is transferred to the die cavity in the molding die. Thus, for example, the structures of the plate-like member and the transfer means can be simplified. In the present example, as mentioned above, the resin is placed on the bump-formed plate-like member in the state where the bump-formed plate-like member is placed on the release film. Thus, for example, in FIGS. 7 to 10, it can be prevented that the resin (the resin material 41a, the flowable resin 41b, and the encapsulation resin 41) and the lower die cavity bottom member 111a are in contact with each other, and the resin is entered into a gap between the lower die 111 and the lower-die peripheral member 112.

In the present invention, a means (mechanism) for transferring the bump-formed plate-like member (in the state where a resin is or is not placed thereon) is not limited to the configuration shown in FIGS. 7 to 10 and may be a transfer means (transfer mechanism) having any of the other configurations. For example, although the release film is a release film having a shape in which a long release film is rolled in FIGS. 7 to 10, the release film is not limited thereto. For example, the shape of the release film may be any shape such as a short release film, a long release film, or a rolled release film. For example, the long release film may be a short release film obtained by cutting (pre-cutting) the long release film or the rolled release film prior to being subjected to the production method of the present invention. In the case of using a pre-cut release film, the transferring the bump-formed plate-like member (transferring the bump-formed plate-like member to a die cavity in a molding die) is, for example, performed in the same manner as in FIG. 1 and the description thereof in JP 2013-187340 A.

Example 3

Yet another example of the present invention is described below. The present example shows yet another example of the production method using compression molding which uses a bump-formed plate-like member having a deformable portion.

The production method of the present example is schematically shown in step cross-sectional views of FIGS. 13 to 16. As shown in FIGS. 13 to 16, the present example is different from Example 2 (FIGS. 7 to 10) in that a release film 100 is not used, and the shape of a plate-like member 11 is different.

In the present example, the outer edge of the plate-like member 11 has a protuberance, so that the central portion of the plate-like member 11 becomes a resin containing portion. More specifically, as shown in FIGS. 11 to 14, the outer edge of the plate-like member 11 has a protuberance on the bump 12-formed surface of the plate-like member 11, so that a wall-like member 11b is formed. Thus, the resin containing portion 11c is formed in the central portion of the plate-like member 11. That is, the outer edge of the plate-like member 11 has a protuberance to form a wall-like member 11b. Thus, the plate-like member 11 has a tray shape (box shape in which the upper surface is opened). The central portion of the plate-like member 11 forms a resin containing portion (tray-shaped concave portion) 11c surrounded by the main body (bottom surface) and the wall-like member (outer edge) 11b of the plate-like member 11. The bumps 12 are formed on the main body (bottom surface) of the plate-like member 11 on the resin containing portion (concave portion) 11c side as shown in FIGS. 11 to 14. The wall-like member 11b is a part of the plate-like member 11 and is different from the bumps 12. For example, the wall-like member 11b may have a function of a heat radiation member or a shielding member that shields an electromagnetic wave. In the case where the plate-like member 11 has a wall-like member 11b, the shapes of the bumps 12 are not limited to particular shapes and may be any shape. However, it is preferred that at least one bump 12 is the plate-like bump. In the present example, because of the resin containing portion 11c, it can be suppressed or prevented that the resin (the resin material 41a, the flowable resin 41b, and the encapsulation resin 41) and the bottom member of a lower die cavity are in contact with each other, and the resin is entered into a gap between the lower-die peripheral member and the bottom member of a lower die cavity without using a release film. Therefore, the costs can be reduced because a release film is not used, and attaching and adsorbing a release film can be omitted. Accordingly, efficiency of producing an electronic component is improved.

In the present example, as a compression molding device including a molding dies (an upper die and a lower die), the same compression molding device as in Example 2 except for having no roll for a release film and an intermediate die can be used as shown in FIGS. 13 to 16. Specifically, as shown in FIGS. 13 to 16, the compression molding device includes, as main components, an upper die 1001 and a lower die 1011. The lower die 1011 includes a bottom member 1011a of a lower die cavity and a lower-die peripheral member (main body of a lower die) 1012. The lower-die peripheral member (main body of a lower die) 1012 is a frame-shaped side member of a lower die cavity. More specifically, the lower-die peripheral member 1012 is arranged so as to surround the bottom member 1011a of a lower die cavity. There is a gap (adsorption hole) 1011c between the bottom member 1011a of a lower die cavity and the lower-die peripheral member 1012. This gap 1011c is, as shown in an arrow 1014 of FIGS. 14 and 15, evacuated with a vacuum pump (not shown), so that the plate-like member can be adsorbed. After the compression molding, as shown in an arrow 1016 of FIG. 16, the plate-like member can be detached by delivering air from this gap 1011c. The height of the upper surface of the lower-die peripheral member 1012 is higher than the height of the upper surface of the bottom member 1011a of a lower die cavity. Accordingly, a lower die cavity (concave portion) 1011b surrounded by the upper surface of the bottom member 1011a of the lower die cavity and the inner peripheral surface of the lower-die peripheral member 1012 is formed. The upper die 1001 has a hole (through hole) 1003. Thus, as shown in an arrow 1007 of FIG. 15, at least lower die cavity 1011b can be evacuated by sucking from the hole 1003 with a vacuum pump (not shown) after the clamping. An O ring 1012a having elasticity is attached to the outer edge of the upper surface of the lower-die peripheral member 1012. Thus compression molding device (device for producing an electronic component) further includes a resin placement means and a transfer means although they are not shown. The resin placement means places a resin on the bump-formed surface of the bump-formed plate-like member. The transfer means transfers the bump-formed plate-like member to a die cavity of a molding die.

In the production method of the present example, as shown in FIGS. 13 to 16, the plate-like member 11 in which the resin material 41a is placed on the resin containing portion 11c is transferred to the position of the lower die cavity 1011b without using a release film. A gap 1011c between the lower-die peripheral member 1012 and the bottom member 1011a of a lower die cavity is evacuated with a vacuum pump (not shown) as shown in an arrow 1014 of FIG. 14 as substitute for causing a release film to be adsorbed to the lower die and the lower-die peripheral member 1012. Thus, the plate-like member 11 is adsorbed to the lower die cavity 1011b (the upper surface of the bottom member 1011a of a lower die cavity and the inner peripheral surface of the lower-die peripheral member 1012). Except for this, the production method of the present example (FIGS. 13 to 16) can be performed in the same manner as in FIGS. 7 to 10 of Example 2.

Figure 14:
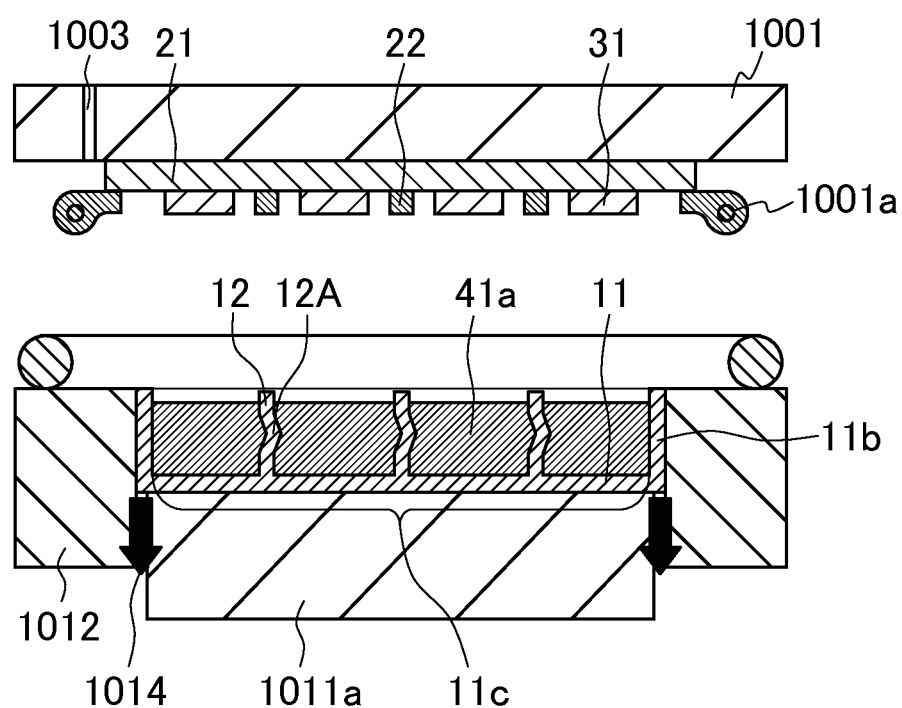
FIG. 14 is a cross-sectional view showing, as an example, yet another step in the same production method as in FIG. 13.
Figure 15:
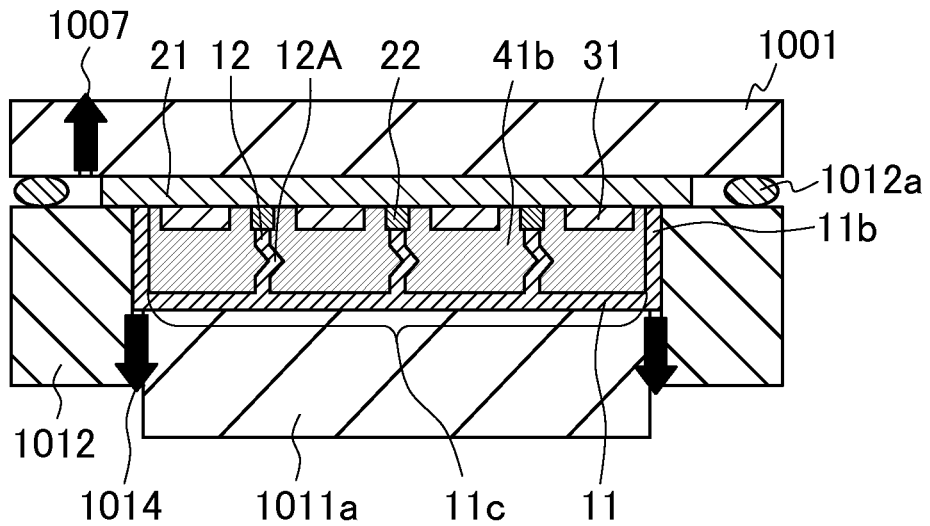
FIG. 15 is a cross-sectional view showing, as an example, yet another step in the same production method as in FIG. 13.
Figure 16:
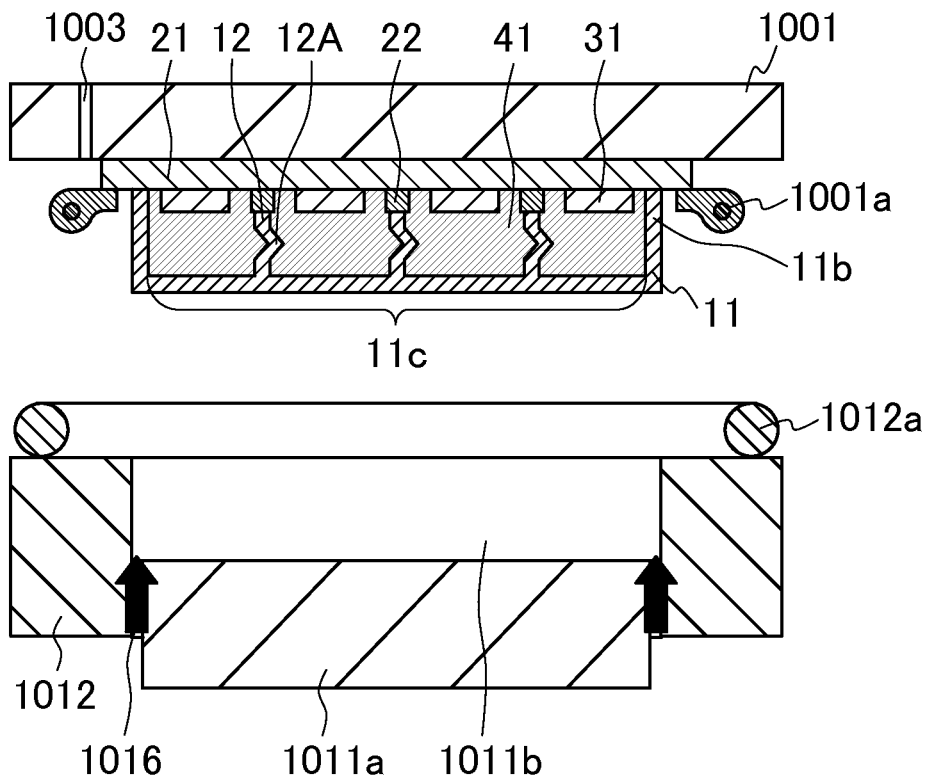
FIG. 16 is a cross-sectional view showing, as an example, yet another step in the same production method as in FIG. 13.
Figure 23:
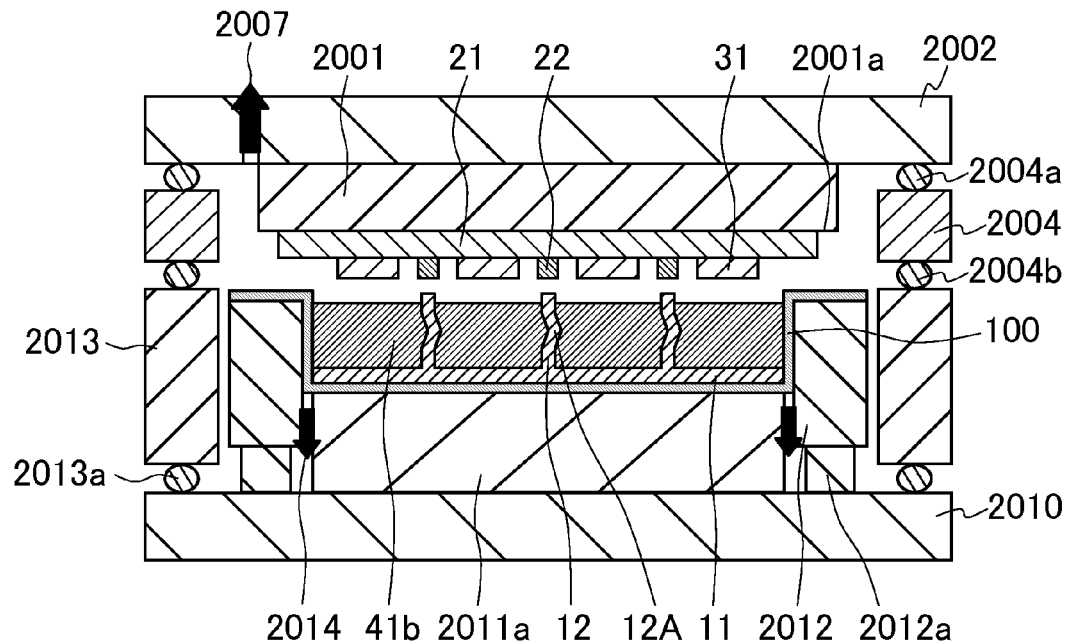
FIG. 23 is a cross-sectional view showing yet another example of the production method according to the present invention using compression molding.

The step (encapsulating) shown in FIGS. 15 and 16 can be, for example, more specifically, performed as follows. That is, first, the lower die 1011 in the state of FIG. 14 is moved upward to cause a die surface of an upper die 1001 to come into contact with an upper end of an O ring 1012a of a lower die. At that time, a required gap between the surface of the upper die (the die surface of the upper die 1001) and the surface of the lower die (the die surface of the lower die 1011) is held. That is, prior to completely clamping the upper die 1001 and the lower die 1011, intermediate clamping of holding a required gap between the upper die 1001 and the lower die 1011 is performed. At the time of this intermediate clamping, an outside air-excluding space can be formed by setting a gap between the surface of the upper die and the surface of the lower die and a cavity space to be in an outside air-excluding state. Moreover, at that time, as shown in an arrow 1007 of FIG. 15, the outside air-excluding space can be set to have a predetermined degree of vacuum by forcedly sucking and discharging air in the outside air-excluding space from the hole 1003 of the upper die. Subsequently, the surface of the upper die (the die surface of the upper die 1001) and the surface of the lower die (the die surface of the lower die 1011) are closed together to perform complete clamping. Moreover, the bottom member 1011a of a cavity is moved upward. At that time, as shown in FIG. 15, the resin material 41a is caused to be in the state of being a flowable resin 41b. Accordingly, as shown in FIG. 15, the bumps 12 and the wiring pattern 22 are joined to each other, chips 31 are immersed in the flowable resin 41*b*, and the flowable resin 41*b* in the lower die cavity 1011*b* is pressurized. Furthermore, as mentioned below, the flowable resin 41*b* is cured to cause the flowable resin 41*b* to be an encapsulation resin (resin) 41 composed of a curable resin as shown in FIG. 23. Thus, chips 31 held on the substrate 11 can be subjected to compression molding (encapsulation molding) in the resin 41 (cured resin) having a required shape. More specifically, as shown in FIG. 16, chips 31 held on the substrate 21 in the lower die cavity 1011*b* (including bumps and a wiring pattern 22) can be subjected to compression molding (resin molding) in the encapsulation resin (resin) 41 composed of a curable resin and thus can be a molded package (resin molding) corresponding to the shape of the lower die cavity 1011*b*. At that time, the plate-like member 11 is in the state of being held on the upper surface side of the molded package, opposite to the substrate 21. At that time, by the pressure force caused by moving the bottom member 1011*a* of a lower die cavity upward, the entire bumps 12 are pressed in the direction perpendicular to the plane direction of the plate-like member 11. By the pressure, as shown in FIG. 16, the deformable portion 12A of each of the bumps 12 designed to have a thickness higher than the flowable resin 41*b* is bent. Accordingly, the bumps 12 are shrunk in the direction perpendicular to the plane direction of the plate-like member 11, and the length of the bumps 12 suits on the predetermined thickness of the resin-encapsulated component. Then, after an elapse of required time necessary to cure the flowable resin 41*b*, as shown in FIG. 16, unclamping the upper die and the lower die is performed. Specifically, the lower die 1011 (the bottom member 1011*a* of a lower die cavity, and the lower-die peripheral member 1012) are caused to move downward together with the O ring 1012*a*. Thus, the lower die cavity 1011*b* is opened to release the depressurization. At that time, the depressurization (evacuation) of the gap between the bottom member 1011*a* of a lower die cavity and the lower-die peripheral member 1012 is released. As shown in an arrow 1016, air may be delivered to the gap. Accordingly, an electronic component (molded article) having a plate-like member 11 that has a resin containing portion 11*c*, a substrate 21, chips 31, a wiring pattern 22, and bumps 12 can be obtained.

The present example is not limited thereto, and for example, the placing the resin may be performed after the transferring the bump-formed plate-like member as in FIGS. 11 to 12 of Example 2. In this case, it is preferred that the bump-formed plate-like member is heated in the lower die cavity prior to the placing the resin as in Example 2 (heating). Moreover, it is preferred that the bump-formed plate-like member is sufficiently subjected to thermal expansion in this heating for the same reason as in Example 2.

Figure 17:
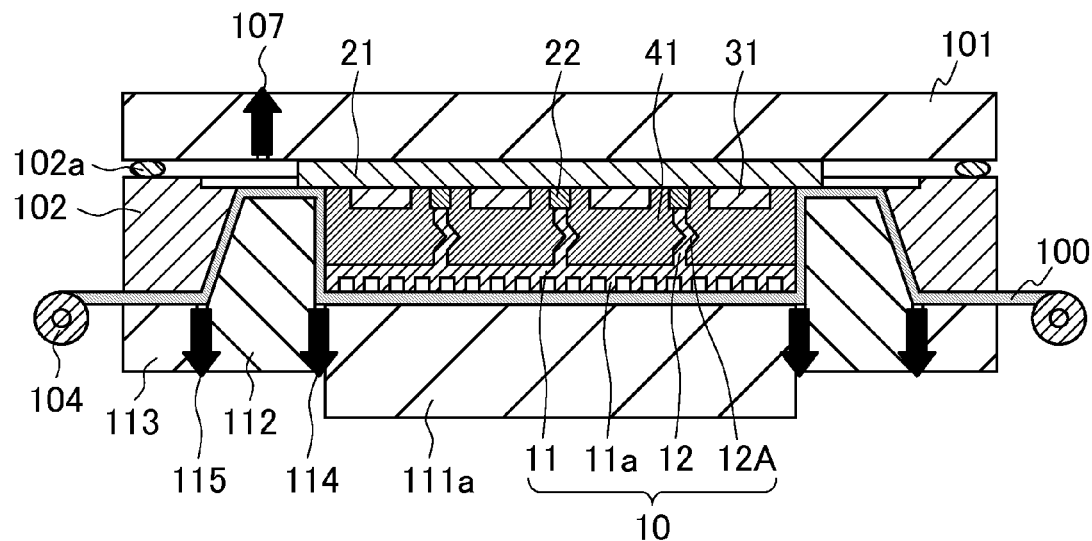
FIG. 17 is a cross-sectional view showing, as an example, a step in yet another example of the production method according to the present invention using compression molding.
Figure 18:
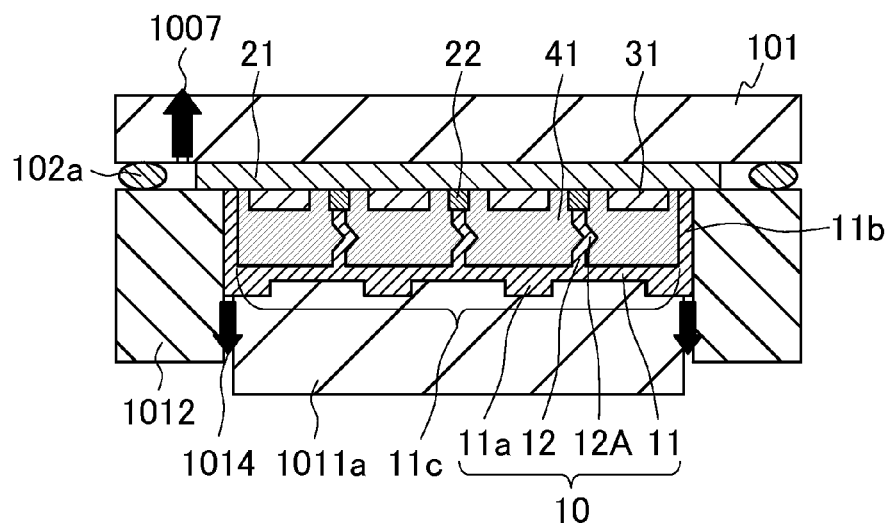
FIG. 18 is a cross-sectional view showing, as an example, a step in yet another example of the production method according to the present invention using compression molding.

In the present invention, the shape of the plate-like member is not limited to the shapes of the present example and Examples 1 to 2 and may be any shape. For example, the plate-like member may have the same shape as the plate-like member shown, as an example, in JP 2013-187340 A except that bumps are formed on the plate-like member. FIGS. 17 and 18 show examples of the production method (Modification) in which the shape of a plate-like member is modified. FIG. 17 is the same as in FIGS. 7 to 10 (Example 2) except that the plate-like member 11 includes a heat radiation fin 11*a* on the surface opposite to the surface in which the bumps 12 are formed (the surface facing the lower die cavity bottom member 111*a* in FIG. 17), and the production method can be performed in the same manner as in Example 2 using the same compression molding device as in FIGS. 7 to 10. FIG. 18 is the same as in FIGS. 13 to 16 (Example 3) except that the plate-like member 11 has a heat radiation fin 11*a* on the surface opposite to the bump 12-formed surface (the surface facing the lower die cavity bottom member 111*a* in FIG. 16), and the production method can be performed in the same manner as in Example 3 using the same compression molding device as in FIGS. 13 to 16. In the compression molding device of FIG. 18, as shown in FIG. 18, the upper surface of the bottom member 1011*a* of a lower die cavity has an uneven shape capable of fitting in the uneven shape of the heat radiation fin 11*a*. Accordingly, there is an advantage in that the plate-like member 11 is stable in the lower die cavity, and the upper surface of the bottom member 1011*a* of a lower die cavity is less prone to be damaged by the heat radiation fin. Moreover, it is preferred that the heat radiation fin 11*a* has a shape in which a space is not formed between the lower-die peripheral member 1012 and the plate-like member 11 as shown in FIG. 18. Accordingly, the suction of the lower die cavity by depressurization (arrow 1014) is effectively performed.

Example 4

Yet another example of the present invention is described below with reference to FIGS. 19 and 20. The present example shows yet another example of the production method using a bump-formed plate-like member having a deformable portion.

Figure 19:
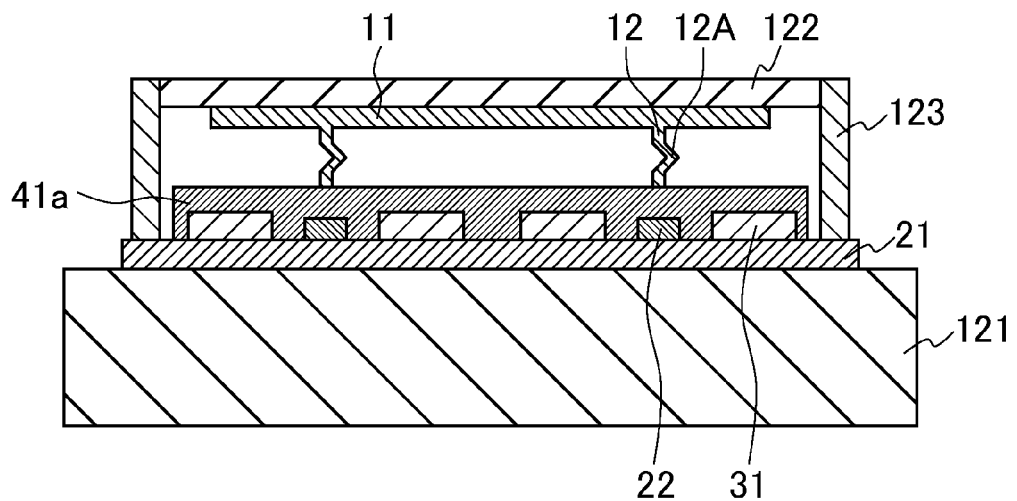
FIG. 19 is a cross-sectional view showing yet another example of the production method according to the present invention.

The production method of the present example is schematically shown in a cross-sectional view of FIG. 19. As shown in FIG. 19, this production method is performed using a lower die 121, an upper die (mounter) 122, and a vacuum chamber 123. The upper surface of the lower die 121 is a flat surface, and the substrate of the electronic component can be placed on the upper surface. The vacuum chamber 123 has a columnar shape corresponding to the shape of the electronic component and can be placed on the substrate of the electronic component. The upper die 122 can be fit in the inner wall of the vacuum chamber 123.

In the production method according to the present example, first, in the substrate 21 on one surface of which chips 31 and a wiring pattern 22 are fixed, a resin material (resin)41*a* composed of a liquid resin (thermosetting resin) is printed on the surface on which chips 31 and a wiring pattern 22 are fixed. Subsequently, the bumps 12 of the bump-formed plate-like member in which the bumps 12 are formed on the plate-like member 11 is caused to be in contact with the wiring pattern 22 by causing the bumps 12 to penetrate the liquid resin 41*a*. Thus, the substrate 21, the chips 31, the liquid resin 41*a*, the plate-like member 11, and the bumps 12 are arranged so as to have the same positional relationship as in a completed resin-encapsulated electronic component 20 (FIG. 5). Then, for example, as shown in FIG. 19, the substrate 21, the chips 31, the liquid resin 41*a*, the plate-like member 11, and the bumps 12 are arranged on the upper surface of the lower die 121 so as to have the positional relationship (arrangement). At that time, as shown in FIG. 19, the surface of the substrate 21, opposite to the chip 31-arranged surface is caused to be in contact with the upper surface of the lower die 121, and the bump-formed plate-like member (plate-like member 11 and bumps 12 each having a deformable portion 12A) is arranged on the chip 31-arranged surface.

Subsequently, the vacuum chamber 123 is placed on a portion of the outer edge of the upper surface of the substrate 21, on which the liquid resin 41*a* is not arranged (placed).

Accordingly, the chips 31, the liquid resin 41a, the plate-like member 11, and the bumps 12 are surrounded by the vacuum chamber 123. Then, the upper die 122 is caused to move downward from the upper side of the chips 31, the liquid resin 41a, the plate-like member 11, and the bumps 12 to cause the upper die 122 to fit in the inner wall of the vacuum chamber 123. Thus, the chips 31, the liquid resin 41a, and the bumps 12 are contained in an inner space sealed by being surrounded by the plate-like member 11, the vacuum chamber 123, and the upper die 122. Moreover, the inner space is evacuated with a vacuum pump (not shown). Accordingly, the chips 31, the liquid resin 41a, the plate-like member 11, and the bumps 12 are pressed by the upper die 122. At that time, the bumps 12 each having a deformable portion 12A is comes into contact with the wiring pattern 22 of the substrate 21. Furthermore, the entire bumps 12 are relatively pressed in the direction perpendicular to the plane direction of the plate-like member 11 by a pressure force of the upper die 122. By this pressure, the deformable portion 12A of each of the bumps 12 designed to have a thickness higher than the liquid resin 41a is bent. Accordingly, the bumps 12 are shrunk in the direction perpendicular to the plane direction of the plate-like member 11, and the length of the bumps 12 suits on the predetermined thickness of the resin-encapsulated component. Then, in this state, the liquid resin (thermosetting resin) 41a is heated and cured, and the chips 31 are subjected to resin-encapsulation together with the plate-like member 11 and the bumps 12. The heating of the liquid resin 41a can be performed by heating the lower die 121, for example. As described above, an electronic component that is the same as the electronic component 20 shown in FIG. 5 can be produced.

In the present example, for example, depressurization with a vacuum chamber may be omitted. However, for example, it is preferred that pressurization with a vacuum chamber is performed when air and a space between the plate-like member and the resin are not allowed to be present or the like. In the case where depressurization with a vacuum chamber is omitted, pressing with the upper die (mounter) may or may not be performed.

Figure 20:
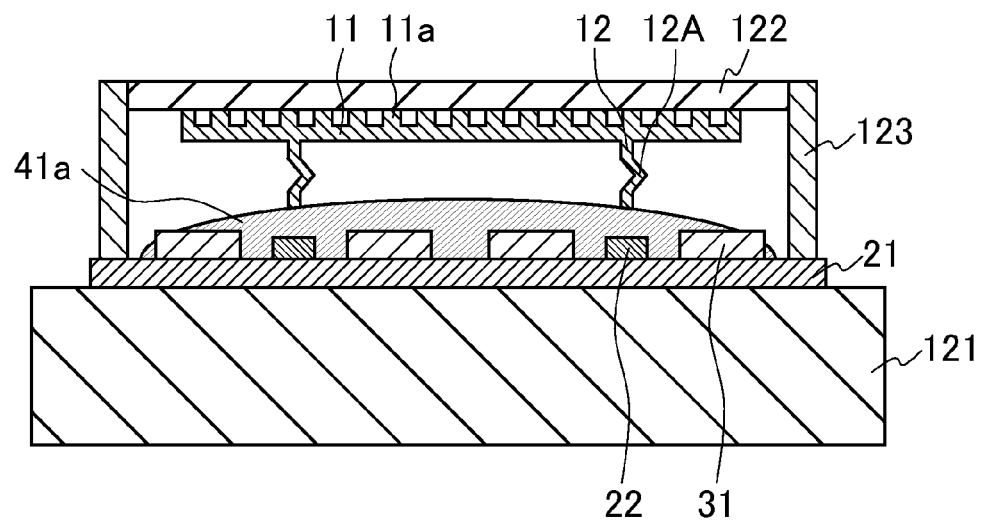
FIG. 20 is a cross-sectional view showing yet another example of the production method according to the present invention.

A modification of the production method of the present example is schematically shown in a cross-sectional view of FIG. 20. The production method in FIG. 20 is the same as the production method in FIG. 19 except that the liquid resin (thermosetting resin) 41a is applied to the surface of the substrate 21, on which the chips 31 and the wiring pattern 22 are fixed as substitute for printing, and the plate-like member 11 has a heat radiation fin 11a on the surface opposite to the bump 12-formed surface (the surface facing the upper die 122 in FIG. 20). In the production method of FIG. 19, a bump-formed plate-like member having a heat radiation fin may be used as in FIG. 20. In the production method of FIG. 20, a bump-formed plate-like member having no heat radiation fin may be used as in FIG. 19. For example, in FIGS. 19 and 20, a resin 41 or 41a may be arranged on the surface of the substrate 21 on which the chips 31 and the wiring pattern 22 are fixed by a laminate of a sheet resin, spin coating of a resin, or the like as substitute for printing or applying of a resin.

Example 5

Yet another example of the present invention is described below. The present example shows a yet another example of the production method using compression molding.

In the present example, a method for producing an electronic component using a pre-cut release film and a rectangle-like frame that has a through hole (resin supply section) and a compression molding device (device for performing resin-encapsulation of electronic components) are described. In the present example, a resin material (granule resin) is transferred and set to the lower die cavity in the state where the resin material (granule resin) is placed on the bump-formed plate-like member having a deformable portion.

In the present example, a frame is arranged on a pre-cut release film, and a bump-formed plate-like member on which the granule resin is placed is arranged on the release film in a frame through hole (resin supply section). Thus, the granule resin can be prevented from being fallen from the bump-formed plate-like member. Although the case where the resin material is a granule resin is described in the present example, the present example can be performed in the same manner as in the case where the resin material is a resin other than a granule resin (e.g., a powdery resin, a liquid resin, a plate-like resin, a sheet-like resin, a film-like resin, a paste-like resin).

The present example is described in more detail below using FIGS. 21 to 24.

Figure 21:
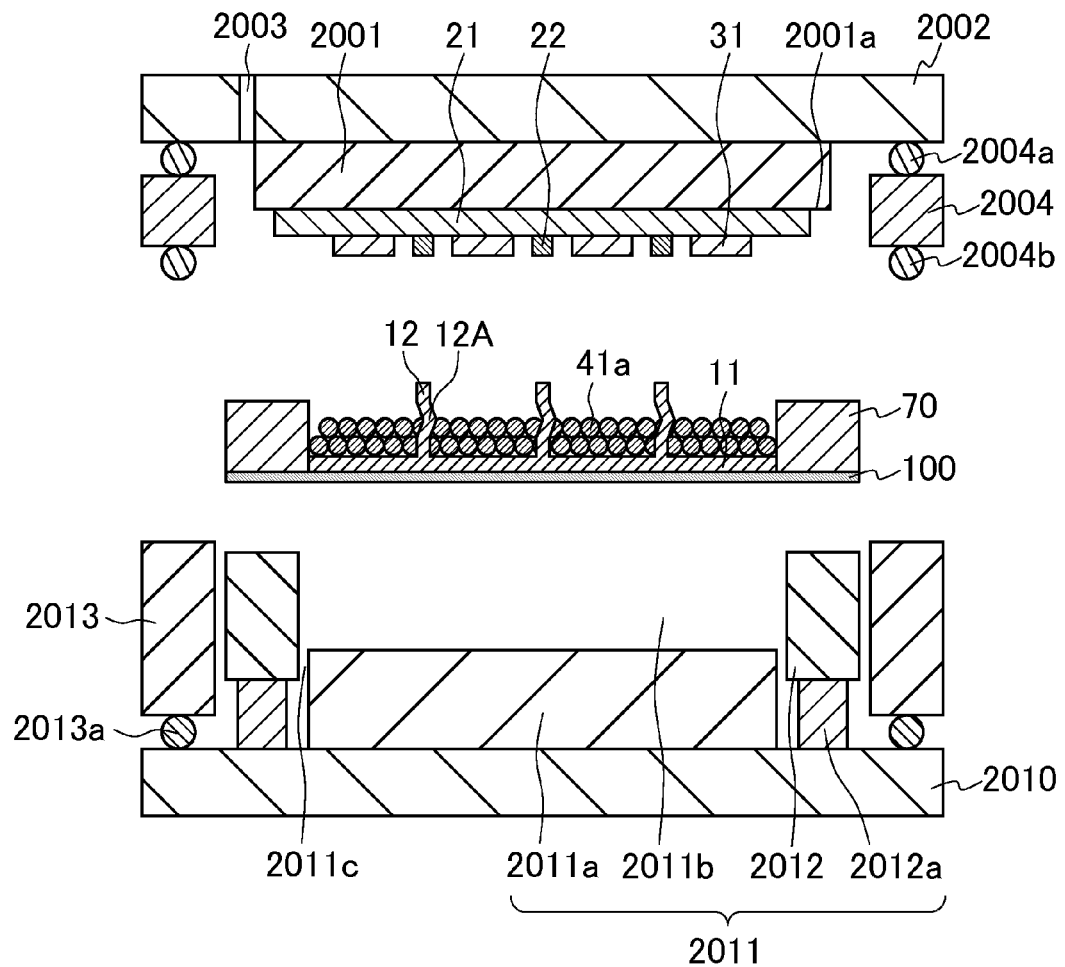
FIG. 21 is a cross-sectional view showing, as an example, a step in yet another example of the production method according to the present invention using compression molding.

The compression molding device (device for producing an electronic component) in the present example is described using FIG. 21. FIG. 21 is a schematic view showing a structure of a part of a molding die (e.g., a mold or a ceramics die) that is a part of the compression molding device. FIG. 21 shows the unclamping state before supplying the resin material to this molding die.

The compression molding device of FIG. 21 is the same as that in Example 3 (FIGS. 13 to 16) in that the molding die includes an upper die and a lower die and is different from that in Example 3 (FIGS. 13 to 16) in that the molding die includes outside air-excluding members of an upper die and outside air-excluding members of a lower die. More specifically, the compression molding device is as follows. That is, the compression molding device of FIG. 21 includes, as main components, an upper die 2001 and a lower die 2011 arranged so as to face the upper die. The upper die 2001 is attached to the upper die base plate 2002 in the state of being vertically suspended from the upper die base plate 2002. Outside air-excluding members 2004 of the upper die are provided in the outer peripheral position of the upper die 2001 that is on the upper die base plate 2002. An O ring 2004a for excluding outside air is provided on the upper end surface of each outside air-excluding member 2004 of the upper die (portion sandwiched between the upper die base plate 2002 and the outside air-excluding member 2004 of the upper die). An O ring 2004b for excluding outside air is provided on the lower end surface of each outside air-excluding member 2004 of the upper die. The upper die base plate 2002 is provided with a hole 2003 for forcedly sucking and discharging air in a space of the mold. A substrate set part 2001a to which the chip 31-attached substrate 21 is supplied and set (attached) in the state where the chip 31-attached surface side faces downward is provided on the die surface (lower surface) of the upper die 2001. The substrate 21 can be attached to the substrate set part 2001a by a clamper (not shown) or the like, for example. A wiring pattern 22 is provided on the chip 31-attached surface of the substrate 21 as in each of the examples.

The lower die 2011 is formed of the lower die cavity bottom member 2011a, an lower-die peripheral member 2012, and an elastic member 2012a. The lower die 2011 further includes a cavity (lower die cavity) 2011b that is a space for molding a resin on the die surface. The lower die cavity bottom member 2011a is provided below the lower die cavity 2011*b*. The lower-die peripheral member (a frame of a lower die, a side member of a cavity) 2012 is arranged so as to surround the lower die cavity bottom member 2011*a*. The height of the upper surface of the lower-die peripheral member 2012 is higher than the height of the upper surface of the lower die cavity bottom member 2011*a*. Accordingly, a lower die cavity (concave portion) 2011*b* surrounded by the upper surface of the lower die cavity bottom member 2011*a* and the inner peripheral surface of the lower-die peripheral member 2012 is formed. There is a gap (adsorption hole) 2011*c* between the lower die cavity bottom member 2011*a* and the lower-die peripheral member 2012. The release film or the like can be adsorbed by evacuating this gap 2011*c* with a vacuum pump (not shown) as mentioned above. The lower die 2011 and the lower-die peripheral member 2012 are attached in the state where they are placed on a lower die base plate 2010. A buffer elastic member 2012*a* is provided between the lower-die peripheral member 2012 and the lower die base plate 2010. Furthermore, the outside air-excluding member 2013 for the lower die is provided in the outer peripheral position of the lower-die peripheral member 2012 on the lower die base plate 2010. An O ring 2013*a* for excluding outside air is provided on the lower end surface of the outside air-excluding member 2013 of a lower die (portion sandwiched between the lower die base plate 2010 and the outside air-excluding member 2013 of the lower die). The outside air-excluding member 2013 for the lower die is arranged immediately below the outside air-excluding member 2004 of the upper die and the O ring 2004*b* for excluding outside air. With the above-described configuration, at least lower die cavity can be in the outside air-excluding state by joining the outside air-excluding member 2004 of the upper die, including the O rings 2004*a* and 2004*b* and the air-excluding member 2013 for the lower die, including the O ring 2013*a* at the time of clamping both of the upper die and the lower die.

The method for producing an electronic component of the present example using this compression molding device is described below. That is, first, as shown in FIG. 21, the substrate 21 is attached to the die surface (substrate set part 2001*a*) of the upper die 2001 as mentioned above. Furthermore, as shown in FIG. 21, the granule resin 41 is supplied to the lower die cavity 2011*b* using a rectangle frame 70 that has a through hole. More specifically, as shown in FIG. 21, the frame 70 is placed on the release film 100 cut to have a required length in advance (pre-cut). At that time, the pre-cut release film 100 is adsorbed and fixed on the lower surface of the frame 70. Subsequently, a bump-formed plate-like member obtained by forming bumps 12 on a plate-like member 11 is placed on a release film 100 from the opening (resin supply section) on an upper side of the through hole of the frame 70. At that time, the bumps 12 are in the state of facing upward (side opposite to the release film 100). In the present example, the bump-formed plate-like member does not include a wall-like member 11*b* and a resin containing portion (concave portion) 11*c* as in Example 2 (FIGS. 7 to 10). The granule resin 41*a* is supplied (placed) on the bump 12-formed surface of the plate-like member 11 in the state where the granule resin 41*a* is flattened. As described above, as shown in FIG. 21, a "resin supply frame" in which the granule resin 41*a* is supplied to the space surrounded by the plate-like member 11 and the frame 70, and the plate-like member 11 and the frame 70 are placed on the release film 100 can be formed. Moreover, the resin supply frame is transferred and, as shown in FIG. 21, caused to enter between the upper die 2001 and the lower die 2011 in the unclamping state (position of the lower die cavity 2011*b*).

Figure 22:
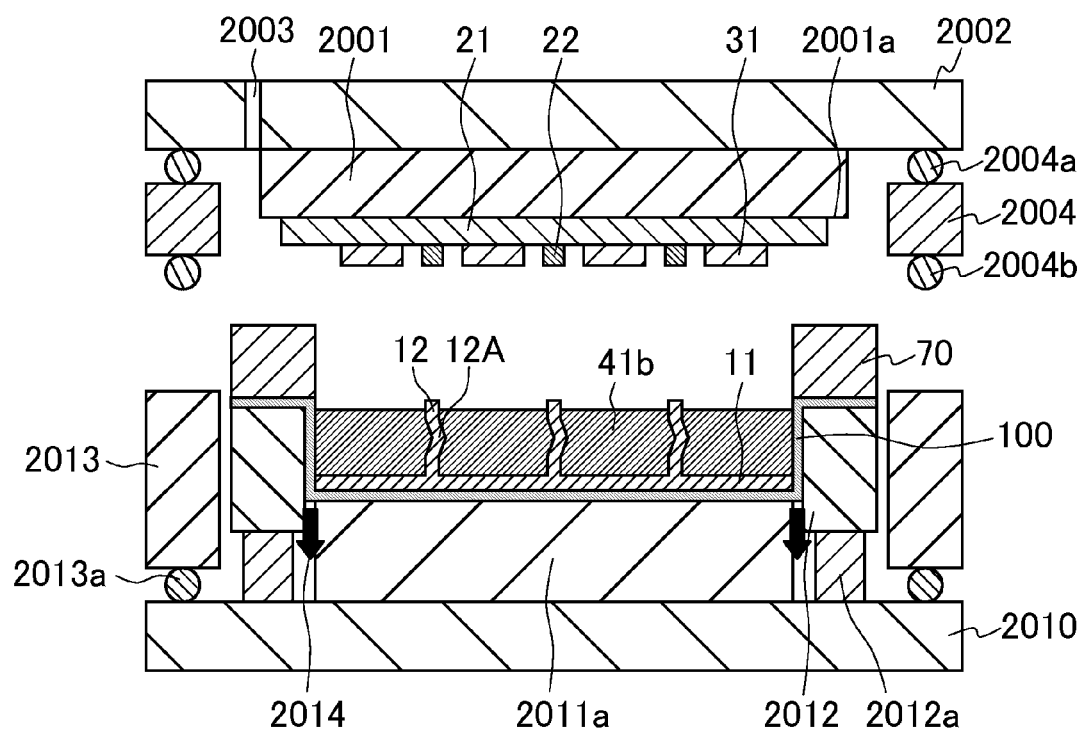
FIG. 22 is a cross-sectional view showing, as an example, a step in yet another example of the production method according to the present invention using compression molding.

Subsequently, the resin supply frame is placed on the die surface of the lower die 2011. At that time, as shown in FIG. 22, the release film 100 is sandwiched between the frame 70 and the lower-die peripheral member 2012, and an opening on the lower side of the through hole of the frame 70 is caused to correspond to an opening (in the surface of the lower die) of the lower die cavity 2011*b*. Moreover, as shown in an arrow 2014 of FIG. 22, the adsorption hole 2011*c* of the lower die is adsorbed with a vacuum pump to evacuate. Accordingly, as shown in FIG. 22, the release film 100 is adsorbed to cover the cavity surface of the lower die cavity 2011*b*, and the granule resin 41 is supplied and set to the lower die cavity 2011*b*. Moreover, the lower die 2011 is heated to melt the granule resin 41*a*, and thus, the granule resin 41*a* is in the state of a flowable resin 41*b* as shown in FIG. 22. Thereafter, the frame 70 is removed while adsorbing the release film 100 to the cavity surface of the lower die cavity 2011*b* by depressurization indicated by the arrow 2014.

Subsequently, the upper die and the lower die are clamped. First, as shown in FIG. 23, intermediate clamping of causing the surface of the substrate (chip 31-fixed surface of the substrate 21) and the surface of the lower die to be in the state of having a required gap is performed. That is, in the state where frame 70 is removed from FIG. 22, the lower die 2011 is moved upward. Accordingly, as shown in FIG. 23, the outside air-excluding member 2004 for the upper die and the outside air-excluding member 2013 for the lower die are closed together in the state of sandwiching an O ring 2004*b* between them. As described above, as shown in FIG. 23, an outside air-excluding space surrounded by the upper die 2001, the lower die 2011, the outside air-excluding member 2004 for the upper die, and the outside air-excluding member 2013 for the lower die is formed. In this state, as shown in an arrow 2007 of FIG. 23, at least the outside air-excluding space is evacuated by suction with a vacuum pump (not shown) through the hole 2003 of the upper die base plate 2002 to set to a predetermined degree of vacuum.

Figure 24:
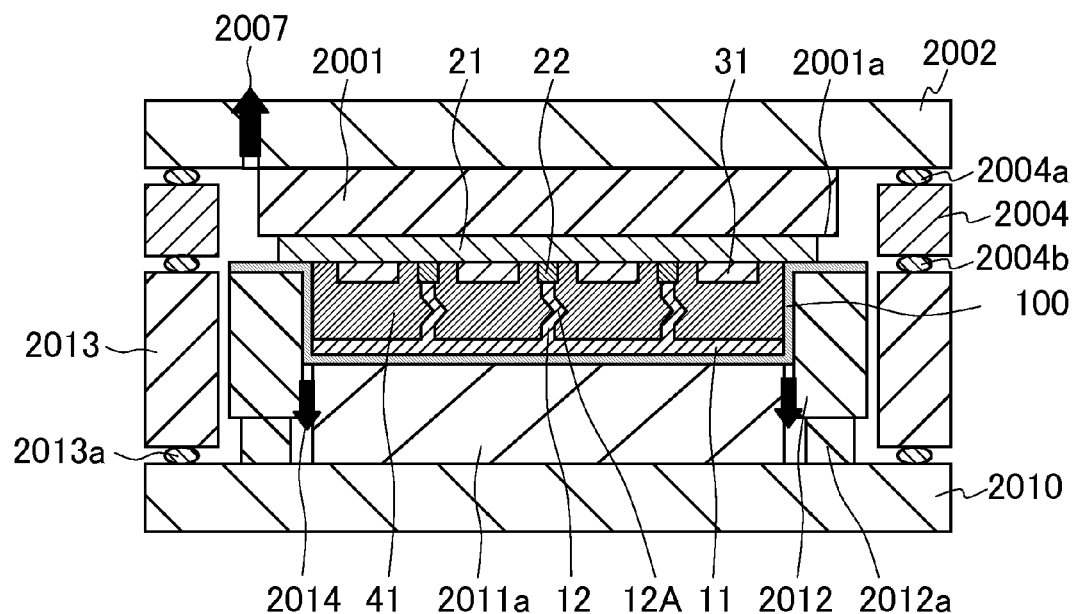
FIG. 24 is a cross-sectional view showing yet another example of the production method according to the present invention using compression molding.

Moreover, as shown in FIG. 24, the surface of the substrate and the surface of the lower die are joined to each other to completely clamp. That is, the lower die 2011 is moved upward from the state of FIG. 23. Accordingly, as shown in FIG. 24, the upper surface of the lower-die peripheral member 2012 comes into contact with the surface of the substrate 21 supplied and set to the upper die 2001 (the chip 31-fixed surface) via the release film 100 (so as to sandwich the release film 100). Then, the bottom member 2011*a* for the lower die cavity is moved further upward by further moving the lower die base plate 2010 upward. At that time, as mentioned above, the resin is caused to be in the state of a flowable resin 41*b*. Accordingly, as shown in FIG. 24, the tips of the bumps 12 come into contact with (are caused to be in contact with) the wiring pattern 22 of the substrate 21, and the chips 31 are immersed in the flowable resin 41*b* in the lower die cavity 2011*b*, and the flowable resin 41*b* is pressurized. At that time, the entire bumps 12 are relatively pressed in the direction perpendicular to the plane direction of the plate-like member 11 by a pressure force of the bottom member 2011*a* for the lower die cavity. By this pressure, as shown in FIG. 24, the deformable portion 12A of each of the bumps 12 designed so as to be higher than the thickness of the flowable resin 41*b* is bent. Accordingly, the bump(s) 12 are shrunk in the direction perpendicular to the plane direction of the plate-like member 11, and the length of the pumps 12 suits on the predetermined thickness of the resin-encapsulated component. At that time, as shown in FIG. 24, the elastic member 2012a and the O rings 2004a, 2004b, and 2013a are shrunk to function as a cushion. Accordingly, as mentioned above, the flowable resin 41b is pressurized to perform compression molding. Then, the flowable resin 41b is cured to cause the flowable resin 41b to be an encapsulation resin. Thus, the chips 31 are encapsulated in the encapsulation resin between the bump 12-formed surface of the plate-like member 11 and the wiring pattern 22-formed surface of the substrate 21, and the bumps 12 can be caused to be in contact with the wiring pattern 22 (encapsulating). After the elapse of time required to cure the flowable resin 41b, the upper die and the lower die are unclamped in the same manner as in Example 2 or 3 (FIG. 10 or 16). Thus, a molded article (electronic component) composed of the substrate 21, the chips 31, the wiring pattern 22, the resin (encapsulation resin) 41, the bumps 12, and the plate-like member 11 can be obtained in the lower die cavity 2011b.

In the present example, the structure of the compression molding device (device for producing an electronic component) is not limited to the structure in FIGS. 21 to 24 and may be the same as or according to the structure of a general compression molding device, for example. Specifically, for example, the structure of the compression molding device may be the same as or according to the structure shown in any of JP 2013-187340 A, JP 2005-225133 A, JP 2010-069656 A, JP 2007-125783 A, JP 2010-036542 A, and the like.

The present invention is not limited by the above-mentioned examples and any appropriate combinations, changes, or selective adoption thereof can be made as necessary without departing from the spirit and scope of the present invention.

For example, the shapes of the bumps in the bump-formed plate-like member are not limited to the shapes shown in FIGS. 2A to 2B, 3, and 4 and may be any shapes. As an example, as mentioned above, at least a part of the bumps may have a plate-like shape. A required area corresponding to one electronic component (one product unit) on the surface of the substrate may be partitioned with the plate-like electrode.

EXPLANATION OF REFERENCE NUMERALS 10 bump-formed plate-like member
11 plate-like member
11a heat radiation fin
11b wall-like member
11c resin containing portion
12 bump
12a lower part of bump 12
12b through hole
12c projection
12A deformable portion
13 hole
20 electronic component (completed resin-encapsulated electronic component)
20' electronic component (resin-encapsulated electronic component)
21 substrate
22 wiring pattern
31 chip (electronic component before resin-encapsulation)
41 resin (encapsulation resin)
41a resin (resin material such as liquid resin or resin granule)
41b resin (flowable resin)
50 molding die
51 upper die
52 lower die
53 plunger
54 pot (hole)
55 resin passage
56 die cavity
57 substrate set part
60 resin supply means
61 resin supply section
62 lower shutter
70 rectangle frame (frame)
100 release film
101 upper die
101a clamper
102 intermediate die (intermediate plate)
102a O ring
103 hole of upper die (through hole)
104 roll
107 depressurization (evacuation)
111 lower die
111a lower die cavity bottom member
111b lower die cavity
111c, 111d gap (suction hole)
112, 113 lower-die peripheral member (main body of lower die)
114, 115 adsorption by depressurization
116 air
121 lower die
122 upper die (mounter)
123 vacuum chamber
1001 upper die
1001a clamper
1003 hole of upper die (through hole)
1007 depressurization (evacuation)
1011 lower die
1011a bottom member of lower die cavity
1011b lower die cavity
1011c, 1011d gap (suction hole)
1012 lower-die peripheral member (main body of lower die)
1012a O ring
1014 adsorption by depressurization
1016 air
2001 upper die
2001a substrate set part
2002 upper die base plate
2003 hole of upper die (through hole)
2004 outside air-excluding member of upper die
2004a, 2004b O ring
2007 depressurization (evacuation)
2010 lower die base plate
2011 lower die
2011a bottom member for lower die cavity
2011b lower die cavity
2011c gap (suction hole)
2012 lower-die peripheral member
2012a elastic member
2013 outside air-excluding member of lower die
2013a O ring
2014 adsorption by depressurization

What is claimed is:
1. A method for producing an electronic component comprising: a substrate having a surface, at least one chip, a resin, a plate-like member having at least one surface, at least one bump that is in a plate shape and includes a deformable portion formed by being folded once or multiple times, and a wiring pattern wherein the plate-like member, the bump and the deformable portion are conductive, the method comprising:

disposing the one chip on the surface of the substrate, and encapsulating the at least one chip in the resin; wherein the encapsulating comprises:

encapsulating the one chip in the resin between a bump-formed surface of the plate-like member on which the one bump is formed and a wiring pattern-formed surface of the substrate on which the wiring pattern is formed such that the deformable portion is located between the bump-formed surface and the wiring pattern-formed surface in a shrunk fashion sandwiched between the bump-formed surface and the wiring pattern-formed surface; and causing the at least one bump to be in contact with the wiring pattern.

2. The method according to claim 1, wherein the at least one bump is a zigzag bump.

3. A method for producing an electronic component comprising: a substrate having a surface, at least one chip, a resin, a plate-like member having at least one surface, at least one bump that includes a deformable portion, and a wiring pattern, the method comprising:

disposing the one chip on the surface of the surface, and encapsulating the at least one chip in the resin; wherein the encapsulating comprises:

encapsulating the one chip in the resin between a bump-formed surface of the plate-like member on which the one bump is formed, and a wiring pattern-formed surface of the substrate on which the wiring pattern is formed; and causing the at least one bump to be in contact with the wiring pattern, the at least one bump comprises a through hole penetrating in a direction parallel with a plane direction of the plate-like member, the deformable portion surrounds the through hole, and the at least one bump has a projection projecting at the end opposite to an end formed in the plate-like member in a direction perpendicular to a plate surface of the plate-like member.

4. The method according to claim 1, wherein the at least one bump is a columnar bump having a columnar shape.

5. The method according to claim 1, wherein the at least one bump is a plate-like bump, the at least one chip comprises plural chips, and the encapsulating comprises partitioning the substrate into plural regions with the plate-like bump and encapsulating the chips in the resin in the plural regions.

6. A method for producing an electronic component comprising: a substrate having a surface, at least one chip, a resin, a plate-like member having at least one surface, at least one bump that includes a deformable portion, and a wiring the pattern, the method comprising:

disposing the one chip on the surface of the substance, and encapsulating the at least one chip in the resin; wherein the encapsulating comprises:

encapsulating the one chip in the resin between a bump-formed surface of the plate-like member on which the one bump is formed, and a wiring pattern-formed surface of the substrate on which the wiring pattern is formed; and causing the at least one bump to be in contact with the wiring pattern, the at least one bump is a plate-like bump, the at least one chip comprises plural chips, and the encapsulating comprises partitioning the substrate into plural regions with the plate-like bump and encapsulating the chips in the resin in the plural regions, the plate-like bump has a through hole and a projection, the through hole penetrates the plate-like bump in a direction parallel with a plate surface of the plate-like member, the deformable portion surrounds the through hole, and the projection projects at an end opposite to an end formed in the plate-like member in a direction perpendicular to the surface of the plate-like member.

7. The method according to claim 1, wherein the plate-like member is a heat radiation plate or a shield plate.

8. The method according to claim 1, wherein the encapsulating is performed by transfer molding.

9. The method according to claim 1, wherein the encapsulating is performed by compression molding.

10. The method according to claim 9, further comprising:

placing the resin on the bump-formed surface of the bump-formed plate-like member; and transferring the bump-formed plate-like member to a die cavity in a molding die, wherein the encapsulating is performed by compression molding of the resin in the die cavity together with the bump-formed plate-like member and the at least one chip in a state where the at least one chip is immersed in the resin placed on the plate-like member.

11. The method according to claim 10, wherein the transferring the bump-formed plate-like member comprises transferring the resin to the die cavity in the molding die together with the bump-formed plate-like member in a state where the resin is placed on the bump-formed plate-like member.

12. The method according to claim 10, further comprising:

heating the bump-formed plate-like member in the die cavity prior to the placing the resin, wherein the transferring the bump-formed plate-like member comprises transferring the bump-formed plate-like member to the die cavity in the molding die in a state where the resin is not placed on the bump-formed plate-like member, and the placing the resin is performed in the die cavity in a state where the bump-formed plate-like member is heated.

13. The method according to claim 10, wherein the transferring the bump-formed plate-like member comprises transferring the bump-formed plate-like member to the die cavity in the molding die in a state where the bump-formed plate-like member is placed on a release film so as to face the bump-formed surface upward.

14. The method according to claim 13, wherein the transferring the bump-formed plate-like member comprises placing a frame on the release film together with the bump-formed plate-like member and transferring the bump-formed plate-like member to the die cavity in the molding die in a state where the bump-formed plate-like member is surrounded by the frame.

15. The method according to claim 14, wherein the placing the resin comprises placing the resin on the bump-formed surface by supplying the resin to a space surrounded by the bump-formed plate-like member and the frame in a state where the frame is placed on the release film together with the bump-formed plate-like member, and the bump-formed plate-like member is surrounded by the frame.

16. The method according to claim 15, wherein
the placing the resin is performed prior to said transferring the plate-like member.

17. The method according to claim 13, wherein
another surface of the bump-formed plate-like member, opposite to the bump-formed surface, is fixed on the release film by a pressure-sensitive adhesive.

18. The method according to claim 10, wherein
the plate-like member includes a resin containing portion,
the placing the resin comprises placing the resin in the resin containing portion, and
the encapsulating is performed in a state where the resin is placed in the resin containing portion.

19. The method according to claim 9, wherein
the encapsulating comprises placing the substrate having the wiring pattern-formed surface on which the at least one chip is arranged, on a substrate placement stage so as to face the wiring pattern-formed surface upward and pressing the resin in a state where the resin is placed on the wiring pattern-formed surface.

20. The method according to claim 1, wherein
the plate-like member is a heat radiation plate, and
the heat radiation plate has a heat radiation fin on a surface opposite to the bump-formed surface.

21. The method according to claim 1, wherein
the resin is a thermoplastic resin or a thermosetting resin.

22. The method according to claim 1, wherein
the resin is at least one selected from the group consisting of a granular resin, a powdery resin, a liquid resin, a plate-like resin, a sheet-like resin, a film-like resin, and a paste-like resin.

23. The method according to claim 1, wherein
the resin is at least one selected from the group consisting of a transparent resin, a semi-transparent resin, and an opaque resin.

24. A bump-formed plate-like member for use in the method according to claim 1, wherein
the at least one bump is formed on the plate-like member.

25. The bump-formed plate-like member according to claim 24, wherein
the at least one bump is a zigzag bump.

26. The bump-formed plate-like member according to claim 24, wherein
the at least one bump is a plate-like bump.

27. A bump-formed plate-like member for use in a method for producing an electronic component comprising: a substrate having a surface, at least one chip, a resin, a plate-like member having at least one surface, at least one bump that includes a deformable portion, and a wiring pattern, the method comprises:
disposing the one chip on the surface of the substrate, and encapsulating the at least one chip in the resin; wherein the encapsulating comprises:
encapsulating the one chip in the resin between a bump-formed surfaced of the plate-like member on which the one bump is formed, and a wiring pattern-formed surface of the substrate on which the wiring pattern is formed; and
causing the at least one bump to be in contact with the wiring pattern,
the at least one bump is formed on the plate-like member,
the at least one bump is a plate-like bump,
the plate-like bump has a through hole and a projection,
the through hole penetrates the plate-like bump in a direction parallel with a plate surface of the plate-like member,
the deformable portion surrounds the through hole, and
the projection projects at an end opposite to an end formed in the plate-like member in a direction perpendicular to the surface of the plate-like member.

28. A bump-formed plate-like member for use in a method for producing an electronic component comprising: a substrate having a surface, at least one chip, a resin, a plate-like member having at least one surface, at least one bump that includes a deformable portion, and a wiring pattern, the method comprising:
disposing the one chip on the surface of the substrate, and encapsulating the at least one chip in the resin; wherein the encapsulating comprises:
encapsulating the one chip in the resin between a bump-formed surface of the plate-like member on which the one bump is formed, and a wiring pattern-formed surface of the substrate on which the wiring pattern is formed; and
causing the at least one bump to be in contact with the wiring pattern,
the at least one bump is formed on the plate-like member,
the at least one bump comprises a through hole penetrating in a direction parallel with a plane direction of the plate-like member,
the deformable portion surrounds the through-hole, and
the at least one bump has a projection projecting at an end opposite to an end formed in the plate-like member in a direction perpendicular to the surface of the plate-like member.

29. The bump-formed plate-like member according to claim 24, wherein
the at least one bump is a columnar bump having a columnar shape.

30. The bump-formed plate-like member according to claim 24, wherein
the plate-like member comprises a resin containing portion.

31. The bump-formed plate-like member according to claim 30, wherein
the plate-like member has a protuberance at an outer edge toward the bump-formed surface of the plate-like member to form the resin containing portion in a central portion of the plate-like member.

32. The bump-formed plate-like member according to claim 24, wherein
a part of the plate-like member is blanked and bent in a direction perpendicular to a plane direction of the plate-like member to form the at least one bump.

33. A method for producing the bump-formed plate-like member according to claim 24, comprising:
forming the at least one bump by etching the plate-like member formed of a metal plate.

34. A method for producing the bump-formed plate-like member according to claim 24, comprising:
joining the plate-like member formed of a metal plate to the at least one bump.

35. A method for producing the bump-formed plate-like member according to claim 24, comprising:
molding the plate-like member and the at least one bump at a same time by electroforming.

36. A method for producing the bump-formed plate-like member according to claim 24, comprising:
molding the plate-like member and the at least one bump at a same time using a conductive resin.

37. A method for forming the bump-formed plate-like member according to claim 24, comprising:
joining the at least one bump to the plate-like member formed of a conductive resin.

38. A method for producing the bump-formed plate-like member according to claim 24, comprising:
providing the plate-like member and the at least one bump with a conductive coating film, wherein
the plate-like member is formed of a resin plate.

39. A method for producing the bump-formed plate-like member according to claim 24, comprising:
blanking and bending a part of a metal plate to form the at least one bump, wherein
the plate-like member is formed of the metal plate.

40. An electronic component, comprising:
a substrate;
at least one chip;
a resin; and
the bump-formed plate-like member according to claim 24, wherein
the at least one chip is arranged on the substrate and encapsulated in the resin,
a wiring pattern is formed on the substrate on a side on which the at least one chip is arranged, and
the at least one bump penetrates the resin and is in contact with the wiring pattern.

41. The method according to claim 1, further comprising:
arranging the bump-formed surface and the wiring pattern-formed surface to face each other with a clearance that is greater than an original longitudinal length (M) of the bump, the original longitudinal length being determined in a longitudinal direction of the bump before the bump connects to the wiring pattern, wherein
the arranging is performed prior to the encapsulating.

42. The method according to claim 1, wherein
during the encapsulating, the clearance is narrowed by moving either or both of the bump-formed surface and the wiring pattern-formed surface until the deformable portion of the bump is shrunk in a perpendicular direction with respect to the writing pattern-formed surface.

43. The method according to claim 1, wherein
the plate-like member is a metal plate that is plastically deformable, and
the bump is formed by cutting out a portion of the metal plate and by folding the cut portion at a right angle to be substantially perpendicular to the bump-formed surface.

44. The method according to claim 1, wherein
the bump extends along a perpendicular line with respect to the wiring pattern formed surface, the line being drawn from the wiring pattern at which the bump is connected.

45. The method according to claim 1, wherein
the bump extends from the plate-like member toward the substrate, not penetrating the plate-like member toward an opposite side from the substrate.

* * * * *